(12) United States Patent
Fang et al.

(10) Patent No.: US 10,573,572 B2
(45) Date of Patent: Feb. 25, 2020

(54) ELECTRONIC DEVICE AND METHOD FOR MANUFACTURING A SEMICONDUCTOR PACKAGE STRUCTURE

(71) Applicant: Advanced Semiconductor Engineering, Inc., Kaohsiung (TW)

(72) Inventors: Hsu-Nan Fang, Kaohsiung (TW); Chien-Ching Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/040,240

(22) Filed: Jul. 19, 2018

(65) Prior Publication Data

US 2020/0027804 A1  Jan. 23, 2020

(51) Int. Cl.
*H01L 23/31* (2006.01)
*H01L 23/498* (2006.01)
*H01L 23/00* (2006.01)
*H01L 21/48* (2006.01)
*H01L 21/56* (2006.01)

(52) U.S. Cl.
CPC ...... *H01L 23/3114* (2013.01); *H01L 21/4853* (2013.01); *H01L 21/563* (2013.01); *H01L 21/565* (2013.01); *H01L 23/49816* (2013.01); *H01L 24/11* (2013.01); *H01L 24/16* (2013.01)

(58) Field of Classification Search
CPC . H01L 21/4853; H01L 21/563; H01L 21/565; H01L 24/11; H01L 24/16
See application file for complete search history.

(56) References Cited

U.S. PATENT DOCUMENTS

| | | | |
|---|---|---|---|
| 8,458,900 B2 | 6/2013 | Kodani et al. | |
| 9,922,845 B1* | 3/2018 | Shih | H01L 21/4853 |
| 2008/0188037 A1* | 8/2008 | Lin | H01L 21/4846 438/108 |
| 2012/0181708 A1* | 7/2012 | Furutani | H01L 23/3128 257/787 |
| 2013/0062761 A1* | 3/2013 | Lin | H01L 23/49816 257/738 |
| 2013/0116159 A1* | 5/2013 | Pollard | C11D 1/72 510/176 |
| 2015/0137384 A1* | 5/2015 | Huemoeller | H01L 23/49816 257/774 |
| 2016/0343655 A1* | 11/2016 | Majeed | H01L 21/31122 |
| 2017/0194238 A1* | 7/2017 | Chiang | H01L 23/49827 |
| 2018/0138115 A1 | 5/2018 | Lu | |

* cited by examiner

*Primary Examiner* — Peniel M Gumedzoe
(74) *Attorney, Agent, or Firm* — Foley & Lardner LLP

(57) ABSTRACT

An electronic device includes an insulating layer, a metal layer and at least one electrical connecting element. The insulating layer has a top surface and a bottom surface opposite to the top surface, and defines an opening extending between the top surface and the bottom surface. The metal layer is disposed in the opening of the insulating layer and has a top surface and a bottom surface opposite to the top surface. The bottom surface of the metal layer is substantially coplanar with the bottom surface of the insulating layer. The electrical connecting element is attached to the bottom surface of the metal layer through a seed layer.

18 Claims, 30 Drawing Sheets

ELECTRONIC DEVICE AND METHOD FOR MANUFACTURING A SEMICONDUCTOR PACKAGE STRUCTURE

BACKGROUND

1. Field of the Disclosure

The present disclosure relates to an electronic device and a manufacturing method for manufacturing a semiconductor package structure, and to an electronic device including an electrical connecting element attached to a metal layer, and a method for manufacturing the semiconductor package structure including the electronic device.

2. Description of the Related Art

Semiconductor chips may be integrated with a large number of electronic components to achieve strong electrical performance. Accordingly, the semiconductor chips are provided with a large number of input/output (I/O) connections. To keep a semiconductor package small while implementing semiconductor chips with a large number of I/O connections, a bonding pad density of a package substrate used for external connection may correspondingly be made large. However, in such implementation, how to plant the solder balls reliably and accurately on the bonding pad of the package substrate may be an issue of concern. In addition, the solder ball planting process is conducted after a molding process and before a singulation process. However, warpage and shrinkage may occur to the semi-product after a molding process, especially when the semi-product has a large size, the difficulty of the solder ball planting process is increased.

SUMMARY

In some embodiments, an electronic device includes an insulating layer, a metal layer and at least one electrical connecting element. The insulating layer has a top surface and a bottom surface opposite to the top surface, and defines an opening extending between the top surface and the bottom surface. The metal layer is disposed in the opening of the insulating layer and has a top surface and a bottom surface opposite to the top surface. The bottom surface of the metal layer is substantially coplanar with the bottom surface of the insulating layer. The electrical connecting element is attached to the bottom surface of the metal layer through a seed layer.

In some embodiments, an electronic device includes an insulating layer, a metal layer and at least one electrical connecting element. The insulating layer has a top surface and a bottom surface opposite to the top surface, and defines an opening extending between the top surface and the bottom surface. The metal layer is disposed in the opening of the insulating layer. The electrical connecting element is attached to the metal layer, and has a top surface and a bottom surface opposite to the top surface. The top surface of the electrical connecting element is substantially coplanar with the bottom surface of the insulating layer.

In some embodiments, a method for manufacturing a semiconductor package structure includes: (a) providing a carrier, wherein the carrier has a first surface and defines a plurality of openings on the first surface; (b) forming a conductive material in the openings of the carrier; (c) forming a wiring structure on the carrier and the conductive material; (d) electrically connecting at least one semiconductor die to the wiring structure; (e) forming an encapsulant to cover the at least one semiconductor die; and (f) removing the carrier.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
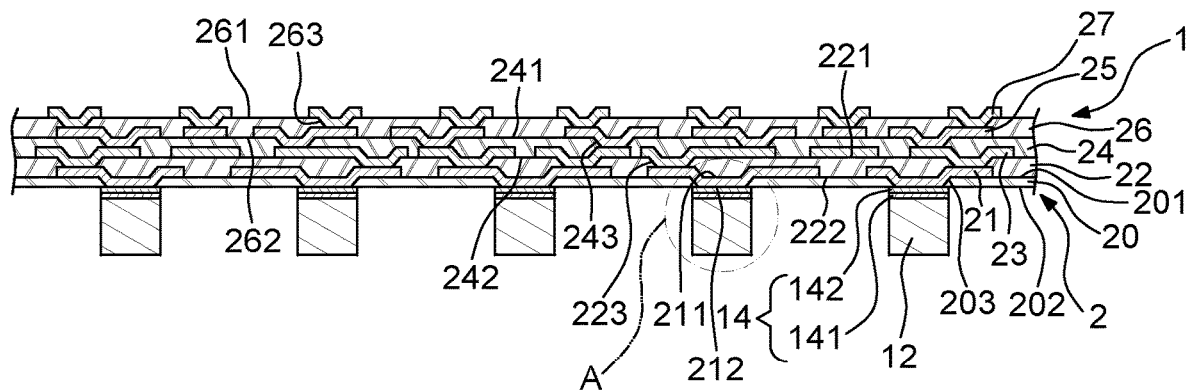
FIG. 1 illustrates a cross-sectional view of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The number of solder balls required for graphic processing unit (GPU) products (such as GPU used for a mobile phone) is greater than 40,000. Therefore, how to plant or mount the solder balls effectively in a limited space of a package substrate is an important issue. In a comparative semiconductor package structure, a gap between the solder balls may be 70 micrometers (μm). If the accuracy of the solder ball planting process or the solder ball mounting process is controlled more accurately, the gap between the solder balls may be reduced to 50 μm. However, during the packaging process of fan-out products, serious warpage and shrinkage may occur to the semi-product after a molding process, especially when the semi-product has a large size (e.g., a 12-inch wafer), the warpage is more serious (e.g., the warpage may be greater than 2 mm), which will increase the difficulty of the subsequent solder ball planting process (or the solder ball mounting process).

For a chip-last packaging process, a substrate structure or a wiring structure (including at least one redistribution layer (RDL) and at least one passivation layer) is formed or disposed on a carrier, then, the chip (or the die) is attached to the substrate structure and electrically connected to the RDL. Finally, a molding compound is formed or disposed to cover the chip (or the die) and a surface of the substrate structure. For example, the Young's modulus of glass carrier or silicone carrier is 100~200 GPa; the Young's modulus of metal carrier is 300 GPa; the Young's modulus of the passivation layer of the substrate structure is 10~30 GPa; and the Young's modulus of the molding compound is 10~30 GPa. Since the Young's modulus of the carrier is much greater than the passivation layer of the substrate structure and the molding compound, the carrier can hold the substrate structure and the molding compound during the packaging process. However, when the carrier is removed after the molding process to form the semi-product (including the substrate structure and the molding compound), warpage and shrinkage will occur to the semi-product due to the CTE mismatch between the substrate structure and the molding compound. Further, delamination may occur between the substrate structure and the molding compound.

In addition, the shrinkage of the substrate structure will cause a pad shift. That is, the bonding pad of the substrate structure is not located at a predetermined position and may shift to an unexpected position. In a worst case, the distance of the pad shift is even greater than a width of the bonding pad (e.g., the distance of the pad shift may be greater than 80 μm). During the solder ball planting process or the solder ball mounting process, the solder balls drop to the bonding pads of the substrate structure through the through holes of a stencil. For an ideal case, each of the through holes of the stencil is located right above each of the bonding pads of the substrate structure, such that the vertical central axis of the solder ball can be aligned with the central axis of the bonding pads. Thus, the solder ball can drop on the center of the bonding pads. In a worse case, the pad shift occurs, however, if the distance of the pad shift is less than one half of the width of the bonding pad, the solder ball that drops on the shifted pad can be drawn back to the top surface of the bonding pad due to the cohesion force of the solder ball during reflow process. That is, when the center of the solder ball falls within the area enclosed by the periphery edge of the bonding pad, the slightly offset solder ball can be pulled back by the cohesion force of the solder ball so that the solder ball still can be mounted on the bonding pad. In a worst case, the distance of the pad shift is greater than one half of the width of the bonding pad, thus, the center of the solder ball will be disposed outside the periphery edge of the bonding pad. Even the solder ball will have the cohesion force during reflow process, the solder ball cannot be pulled back to the top surface of the bonding pad, so that the solder ball cannot be dropped to the predetermined position. That is, the solder ball cannot be mounted on the bonding pad, thus causing the problem that the solder ball falls off. Thus, the yield rate of the bonding between the solder balls and the substrate structure is low. In view of the above, although the increase in the size of the bonding pad can reduce the problem of falling off the solder ball, the increased size of the bonding pad will not achieve the effect of fine pitch of the substrate structure.

The present disclosure addresses at least some of the above concerns and provides for an improved electronic device, and improved techniques for manufacturing a semiconductor package structure including the electronic device. In the electronic device and similarly in the wiring structure or the substrate structure, an electrical connecting element for external connection is formed before a molding process. Thus, the position of the electrical connecting element can be aligned with the position of the bonding pad of the substrate structure, and the problem of falling off will not occur. Further, since the Young's modulus of the carrier is much greater than the passivation layer of the substrate structure and the molding compound, and the carrier is removed after the electrical connecting element is mounted to the wiring structure or the substrate structure, the carrier can hold the substrate structure and the molding compound during the packaging process. Thus, the warpage and shrinkage will not occur to the substrate structure and the molding compound, and the delamination will not occur between the substrate structure and the molding compound.

FIG. 1 illustrates a cross-sectional view of an electronic device 1 according to some embodiments of the present disclosure. The electronic device 1 includes a wiring structure 2, a seed layer 14 and at least one electrical connecting element 12. The wiring structure 2 may be a substrate structure, and may include a first insulating layer 20, a first metal layer 21, a second insulating layer 22, a second metal layer 23, a third insulating layer 24, a third metal layer 25, a fourth insulating layer 26, at least one under bump metallization (UBM) 27.

The first insulating layer 20 has a top surface 201 and a bottom surface 202 opposite to the top surface 201. The first insulating layer 20 defines at least one opening 203 extending through the first insulating layer 20. The opening 203 extending between the top surface 201 and the bottom surface 202. A material of the first insulating layer 20 may include an insulating material, a passivation material, a dielectric material or a solder resist material, such as, for example, a benzocyclobutene (BCB) based polymer or a polyimide (PI). In some embodiments, the first insulating layer 20 may include a cured photoimageable dielectric (PID) material, such as an epoxy or a PI including photoinitiators. A thickness of the first insulating layer 20 may be greater than about 5 μm. In some embodiments, the thickness of the first insulating layer 20 may be about 7 μm.

The first metal layer 21 may be a patterned circuit structure (e.g., a redistribution layer (RDL)), and is disposed on the top surface 201 of the first insulating layer 20 and in the opening 203 of the first insulating layer 20. A seed layer (not shown) may be further included between the first metal layer 21 and the first insulating layer 20. A material of the seed layer may be titanium, copper, another metal or an alloy, and may be formed by, for example, sputtering. A material of the first metal layer 21 may include copper, and may be formed by, for example, plating. A thickness of the first metal layer 21 may be greater than or equal to the thickness of the first insulating layer 20. In some embodiments, the thickness of the first insulating layer 20 may be greater than about 5 μm. The first metal layer 21 has a top surface 211 and a bottom surface 212 opposite to the top surface 211. The bottom surface 212 of the first metal layer 21 is exposed from the bottom surface 202 of the first insulating layer 20, and is substantially coplanar with the bottom surface 202 of the first insulating layer 20. The exposed portion of the bottom surface 212 of the first metal layer 21 forms a bonding pad for external connection.

The second insulating layer 22 covers at least portions of the first insulating layer 20 and the first metal layer 21. As shown in FIG. 1, the second insulating layer 22 is disposed on the top surface 201 of the first insulating layer 20. The second insulating layer 22 has a top surface 221 and a bottom surface 222 opposite to the top surface 221. The second insulating layer 22 defines at least one opening 223 extending through the second insulating layer 22 to expose a portion of the first metal layer 21. A material of the second insulating layer 22 may include an insulating material, a passivation material, a dielectric material or a solder resist material, such as, for example, a benzocyclobutene (BCB) based polymer or a polyimide (PI). In some embodiments, the second insulating layer 22 may include a cured photoimageable dielectric (PID) material, such as an epoxy or a PI including photoinitiators. A thickness of the second insulating layer 22 may be about 9 μm.

The second metal layer 23 may be a patterned circuit structure (e.g., a redistribution layer (RDL)), and is disposed on the top surface 221 of the second insulating layer 22 and in the opening 223 of the second insulating layer 22 to contact or electrically connected to the exposed portion of the first metal layer 21. A seed layer (not shown) may be further included between the second metal layer 23 and the second insulating layer 22. A material of the seed layer may be titanium, copper, another metal or an alloy, and may be formed by, for example, sputtering. A material of the second metal layer 23 may include copper, and may be formed by, for example, plating. A thickness of the second metal layer 23 may be about 8 μm.

The third insulating layer 24 covers at least portions of the second insulating layer 22 and the second metal layer 23. As shown in FIG. 1, the third insulating layer 24 is disposed on the top surface 221 of the second insulating layer 22. The third insulating layer 24 has a top surface 241 and a bottom surface 242 opposite to the top surface 241. The third insulating layer 24 defines at least one opening 243 extending through the third insulating layer 24 to expose a portion of the second metal layer 23. A material of the third insulating layer 24 may include an insulating material, a passivation material, a dielectric material or a solder resist material, such as, for example, a benzocyclobutene (BCB) based polymer or a polyimide (PI). In some embodiments, the third insulating layer 24 may include a cured photoimageable dielectric (PID) material, such as an epoxy or a PI including photoinitiators. A thickness of the third insulating layer 24 may be about 9 μm.

The third metal layer 25 may be a patterned circuit structure (e.g., a redistribution layer (RDL)), and is disposed on the top surface 241 of the third insulating layer 24 and in the opening 243 of the third insulating layer 24 to contact or electrically connected to the exposed portion of the second metal layer 23. A seed layer (not shown) may be further included between the third metal layer 25 and the third insulating layer 24. A material of the seed layer may be titanium, copper, another metal or an alloy, and may be formed by, for example, sputtering. A material of the third metal layer 25 may include copper, and may be formed by, for example, plating. A thickness of the third metal layer 25 may be about 8 μm.

The fourth insulating layer 26 covers at least portions of the third insulating layer 24 and the third metal layer 25. As shown in FIG. 1, the fourth insulating layer 26 is disposed on the top surface 241 of the third insulating layer 24. The fourth insulating layer 26 has a top surface 261 and a bottom surface 262 opposite to the top surface 261. The fourth insulating layer 26 defines at least one opening 263 extending through the fourth insulating layer 26 to expose a portion of the third metal layer 25. A material of the fourth insulating layer 26 may include an insulating material, a passivation material, a dielectric material or a solder resist material, such as, for example, a benzocyclobutene (BCB) based polymer or a polyimide (PI). In some embodiments, the fourth insulating layer 26 may include a cured photoimageable dielectric (PID) material, such as an epoxy or a PI including photoinitiators. A thickness of the fourth insulating layer 26 may be about 9 μm.

The UBM 27 is electrically connected to the third metal layer 25. As shown in FIG. 1, the UBM 27 is disposed in the opening 263 of the fourth insulating layer 26, and a portion of the UBM 27 may extend on the top surface 261 of the fourth insulating layer 26. In some embodiments, the UBM 27 includes a UBM seed layer, a copper layer, a nickel layer and a gold layer sequentially disposed in the opening 263 of the fourth insulating layer 26. A material of the UBM seed layer may be titanium, copper, another metal or an alloy.

As stated above, the wiring structure 2 includes four insulating layers (or passivation layers) and three metal layers, and is referred to as a "4P3M" structure. It is noted that the wiring structure 2 may be a "5P4M" structure that includes five insulating layers (or passivation layers) and four metal layers, a "5P5M" structure that includes five insulating layers (or passivation layers) and five metal layers, or a "1P1M" structure that includes one insulating layer (or passivation layer) and one metal layer.

The seed layer 14 may include a first conductive layer 141 and a second conductive layer 142. A material of the first conductive layer 141 of the seed layer 14 includes titanium-tungsten (TiW) alloy that may be formed by physical vapor deposition (PVD). A material of the second conductive layer 142 of the seed layer 14 includes copper that may be formed by physical vapor deposition (PVD). A thickness of the first conductive layer 141 may be less than 1 and a thickness of the second conductive layer 142 may be less than 1 As shown in FIG. 1, the seed layer 14 protrudes from the bottom surface 212 of the first metal layer 21. That is, the seed layer 14 is disposed on and below the bottom surface 212 of the first metal layer 21. The second conductive layer 142 of the seed layer 14 contacts and/or is electrically connected to the exposed portion of the bottom surface 212 of the first metal layer 21 of the wiring structure 2.

The electrical connecting element 12 (e.g., solder bump) is attached to and electrically connected to the bottom surface 212 of the first metal layer 21 through the seed layer 14 for external connection. As shown in FIG. 1, the electrical connecting element 12 is attached to and electrically connected to the first conductive layer 141 of the seed layer 14. That is, the electrical connecting element 12 protrudes from a bottom surface of the seed layer 14 and the bottom surface 202 of the first insulating layer 20. A material of the electrical connecting element 12 includes silver-tin (AgSn) alloy. A thickness of the electrical connecting element 12 may be greater than about 20 μm. The electrical connecting element 12 is in a shape of a rectangular column, a cylinder or other pillar type since a reflow process is not conducted to the electronic device 1. That is, the electrical connecting element 12 of FIG. 1 is not in a ball shape.

In the embodiment illustrated in FIG. 1, the electrical connecting element 12 and the seed layer 14 are formed before the formation of the wiring structure 2. Thus, the electrical connecting element 12 and the seed layer 14 are disposed right on the exposed portion (e.g., bonding pad) of the bottom surface 212 of the first metal layer 21 of the wiring structure 2. That is, the vertical central axis of the electrical connecting element 12 and the seed layer 14 can be substantially aligned with the central axis of the exposed portion (e.g., bonding pad) of the bottom surface 212 of the first metal layer 21. In addition, even a warpage occurs to the wiring structure 2, the electrical connecting element 12 and the seed layer 14 may shift or move together with the exposed portion (e.g., bonding pad) of the bottom surface 212 of the first metal layer 21. Thus, the yield rate of the bonding between the electrical connecting element 12 and the wiring structure 2 is improved. Further, the size of the exposed portion (e.g., bonding pad) of the bottom surface 212 of the first metal layer 21 does not need to be enlarged. In some embodiments, a gap between the electrical connecting elements 12 may be less than about 70 μm, about 60 μm, or about 50 μm, and an aspect ratio (thickness/width) of the electrical connecting elements 12 may be greater than or equal to about 1, about 1.2, about 1.5, or about 2.

Figure 2:
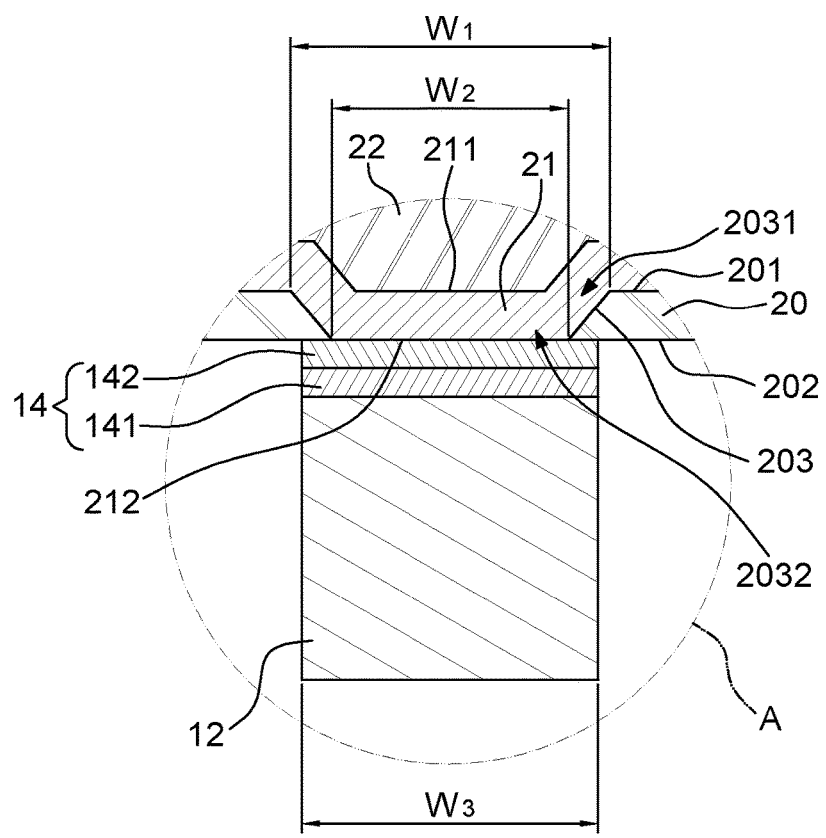
FIG. 2 illustrates an enlarged view of an area "A" shown in FIG. 1.

FIG. 2 illustrates an enlarged view of an area "A" shown in FIG. 1. The opening 203 of the first insulating layer 20 includes a top portion 2031 and a bottom portion 2032. The top portion 2031 has a first width $W_1$, and the bottom portion 2032 has a second width $W_2$. The first width $W_1$ of the top portion 2031 is greater than the second width $W_2$ of the bottom portion 2032, thus, the opening 203 tapers from the top portion 2031 to the bottom portion 2032. However, in other embodiment, the first width $W_1$ of the top portion 2031 may be substantially equal to the second width $W_2$ of the bottom portion 2032. It is noted that the second width $W_2$ of the bottom portion 2032 is the width of the exposed portion (e.g., bonding pad) of the bottom surface 212 of the first metal layer 21. A width of the electrical connecting element 12 is substantially equal to a width of the seed layer 14, both are defined as a third width $W_3$. The second width $W_2$ of the exposed portion (e.g., bonding pad) of the bottom surface 212 of the first metal layer 21 is less than or equal to the third width $W_3$ of the electrical connecting element 12 and the seed layer 14 (e.g., may be about 1.0 time, about 0.9 times less, about 0.8 times less, about 0.7 times less, or about 0.6 times less). For example, a ratio of ($W_2/W_3$) may be in a range of 1.0~0.8, 0.9~0.7, or 0.8~0.6. As shown in FIG. 2, the central portion of the seed layer 14 may contact the entire exposed portion (e.g., bonding pad) of the bottom surface 212 of the first metal layer 21, and the periphery portion (e.g., the left side and the right side) of the seed layer 14 may contact the bottom surface 202 of the first insulating layer 20. It is noted that the entire exposed portion (e.g., bonding pad) of the bottom surface 212 of the first metal layer 21 is connected to the central portion of the seed layer 14 by chemical means (e.g., PVD), and the bottom surface 202 of the first insulating layer 20 is connected to the periphery portion (e.g., the left side and the right side) of the seed layer 14 by physical means (e.g., adhesion). Thus, a bonding force between the exposed portion (e.g., bonding pad) of the bottom surface 212 of the first metal layer 21 and the seed layer 14 is greater than a bonding force between the bottom surface 202 of the first insulating layer 20 and the seed layer 14.

Figure 3:
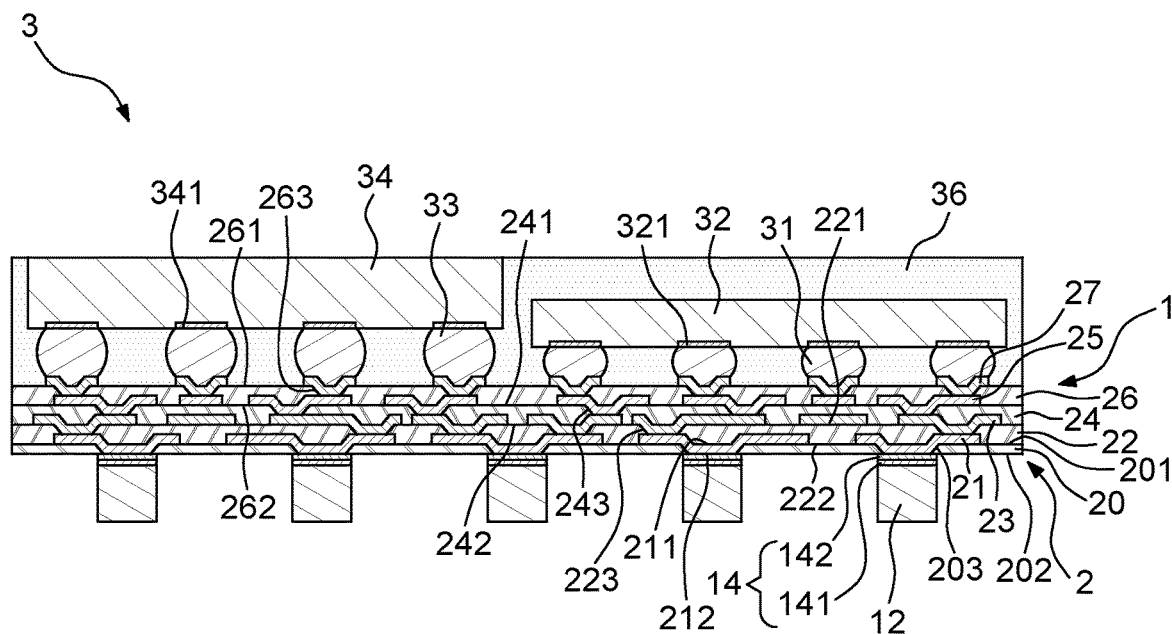
FIG. 3 illustrates a cross-sectional view of an electronic device according to some embodiments of the present disclosure.

FIG. 3 illustrates a cross-sectional view of an electronic device 3 according to some embodiments of the present disclosure. The electronic device 3 of FIG. 3 is a semiconductor package structure, and includes the electronic device 1 of FIG. 1, a first semiconductor die 32, at least one first interconnecting element 31, a second semiconductor die 34, at least one second interconnecting element 33 and an encapsulant 36. The electronic device 1 includes the wiring structure 2, the seed layer 14 and the electrical connecting element 12 as stated above. The function and the size of the first semiconductor die 32 may be the same as or different from the function and the size of the second semiconductor die 34. The first semiconductor die 32 is electrically connected to the third metal layer 25 of the wiring structure 2 through the first interconnecting element 31 and the UBM 27. For example, the first semiconductor die 32 includes at least one first bump pad 321. The first interconnecting element 31 is disposed on the UBM 27 and connected to the first bump pad 321. In some embodiments, the first interconnecting element 31 may be formed of a pre-solder or a solder ball. Similarly, the second semiconductor die 34 is electrically connected to the third metal layer 25 of the wiring structure 2 through the second interconnecting element 33 and the UBM 27. For example, the second semiconductor die 34 includes at least one second bump pad 341. The second interconnecting element 33 is disposed on the UBM 27 and connected to the second bump pad 341. In some embodiments, the second interconnecting element 33 may be formed of a pre-solder or a solder ball.

The encapsulant 36 is disposed on the fourth insulating layer 26, and encapsulates and covers the first semiconductor die 32, the first interconnecting element 31, the second semiconductor die 34, the second interconnecting element 33 and the UBM 27. A material of the encapsulant 36 may be a molding compound with or without fillers. The encapsulant 36 and the wiring structure 2 are singulated concurrently so that a side surface of the encapsulant 36 is substantially coplanar with a side surface of the wiring structure 2.

Figure 4:
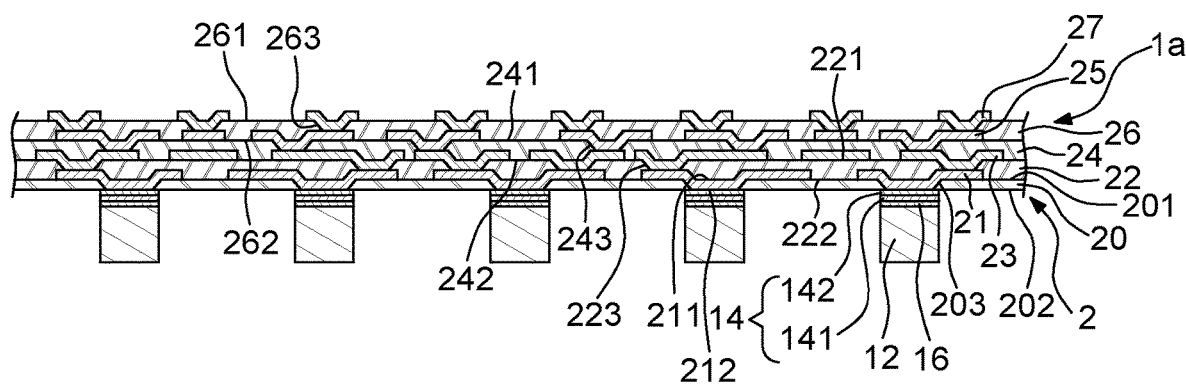
FIG. 4 illustrates a cross-sectional view of an electronic device according to some embodiments of the present disclosure.

FIG. 4 illustrates a cross-sectional view of an electronic device 1a according to some embodiments of the present disclosure. The electronic device 1a is similar to the electronic device 1 shown in FIG. 1 and FIG. 2, except that the electronic device 1a further includes a barrier layer 16 interposed between the electrical connecting element 12 and the first conductive layer 141 of the seed layer 14. A material of the barrier layer 16 may include nickel that may be formed by physical vapor deposition (PVD). A thickness of the barrier layer 16 may be less than 1 μm. In the embodiment illustrated in FIG. 1 and FIG. 2, no barrier layer is included, thus, during the reflow process, the copper in the second conductive layer 142 of the seed layer 14 and in the first metal layer 21 may enter the electrical connecting element 12 rapidly, so as to form the intermetallic compounds (IMCs) such as $Cu_6Sn_5$ and $Cu_3Sn_4$. The $Cu_3Sn_4$ IMC is a brittle material that may reduce the reliability of the bonding between the electrical connecting element 12 and the first metal layer 21. As shown in FIG. 4, the barrier layer 16 can suppress the formation of the IMCs especially the formation of the $Cu_3Sn_4$ IMC, thus, increasing the reliability of the bonding between the electrical connecting element 12 and the first metal layer 21.

Figure 5:
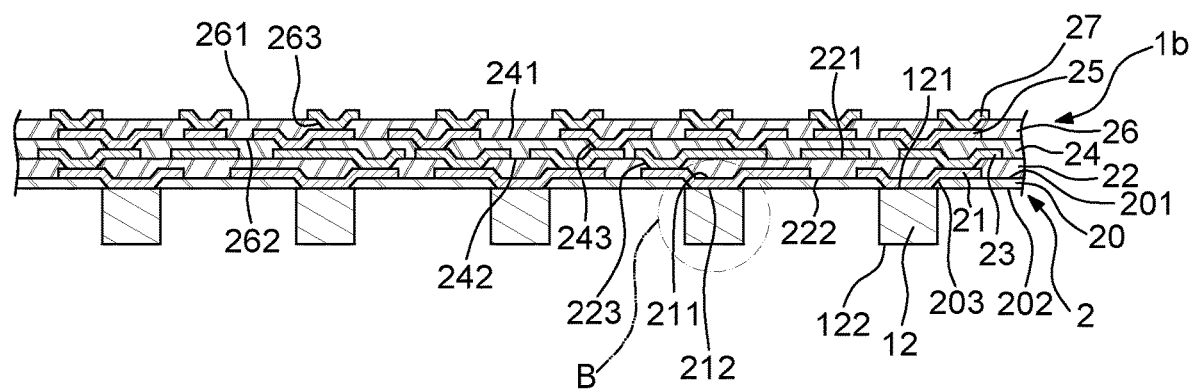
FIG. 5 illustrates a cross-sectional view of an electronic device according to some embodiments of the present disclosure.

FIG. 5 illustrates a cross-sectional view of an electronic device 1b according to some embodiments of the present disclosure. The electronic device 1b is similar to the electronic device 1 shown in FIG. 1 and FIG. 2, except that the seed layer 14 of the electronic device 1 is omitted. Thus, the electrical connecting element 12 is attached to and electrically connected to the exposed portion of the bottom surface 212 of the first metal layer 21 for external connection. The electrical connecting element 12 has a top surface 121 and a bottom surface 122 opposite to the top surface 121. The top surface 121 of the electrical connecting element 12 is substantially coplanar with the bottom surface 202 of the first insulating layer 20. As shown in FIG. 5, the electrical connecting element 12 protrudes from the bottom surface 212 of the first metal layer 21 and the bottom surface 202 of the first insulating layer 20. The electrical connecting element 12 is in a shape of a rectangular column, a cylinder or other pillar type since a reflow process is not conducted to the electronic device 1b. The electrical connecting element 12 is formed before the formation of the wiring structure 2. Thus, the electrical connecting element 12 is disposed right on the exposed portion (e.g., bonding pad) of the bottom surface 212 of the first metal layer 21 of the wiring structure 2. That is, the vertical central axis of the electrical connecting element 12 can be substantially aligned with the central axis of the exposed portion (e.g., bonding pad) of the bottom surface 212 of the first metal layer 21. In addition, even a warpage occurs to the wiring structure 2, the electrical connecting element 12 may shift or move together with the exposed portion (e.g., bonding pad) of the bottom surface 212 of the first metal layer 21. Thus, the yield rate of the bonding between the electrical connecting element 12 and the wiring structure 2 is improved. Further, the size of the exposed portion (e.g., bonding pad) of the bottom surface 212 of the first metal layer 21 does not need to be enlarged.

Figure 6:
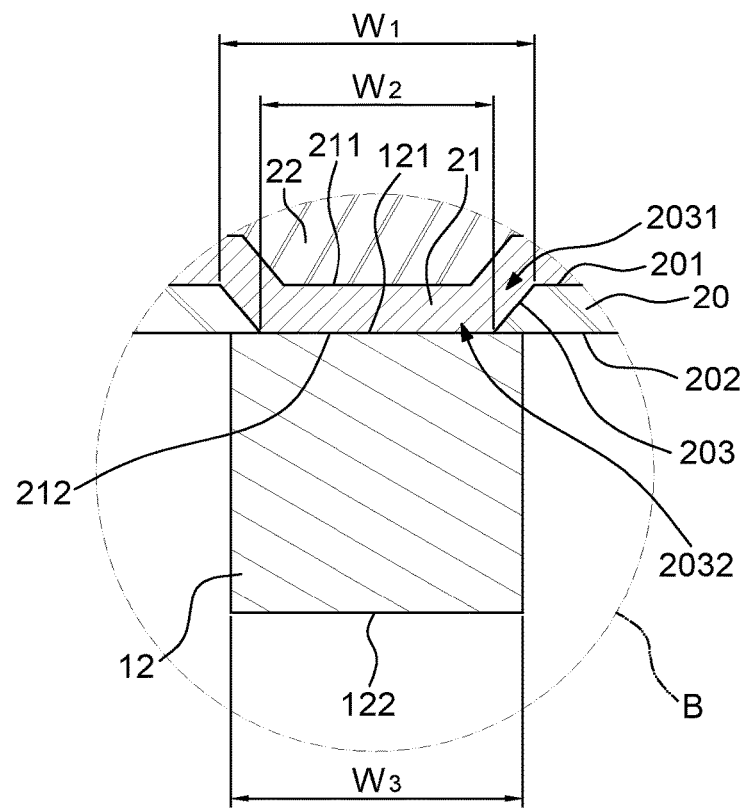
FIG. 6 illustrates an enlarged view of an area "B" shown in FIG. 5.

FIG. 6 illustrates an enlarged view of an area "B" shown in FIG. 5. The opening 203 of FIG. 6 is the same as the opening 203 of FIG. 2, and tapers from the top portion 2031 to the bottom portion 2032. A width of the electrical connecting element 12 is defined as the third width $W_3$. The second width $W_2$ of the exposed portion (e.g., bonding pad) of the bottom surface 212 of the first metal layer 21 is less than or equal to the third width $W_3$ of the electrical connecting element 12 (e.g., may be about 1.0 time, about 0.9 times less, about 0.8 times less, about 0.7 times less, or about 0.6 times less). For example, a ratio of ($W_2/W_3$) may be in a range of 1.0~0.8, 0.9~0.7, or 0.8~0.6. As shown in FIG. 6, the central portion of the electrical connecting element 12 may contact the entire exposed portion (e.g., bonding pad) of the bottom surface 212 of the first metal layer 21, and the periphery portion (e.g., the left side and the right side) of the electrical connecting element 12 may contact the bottom surface 202 of the first insulating layer 20. It is noted that the entire exposed portion (e.g., bonding pad) of the bottom surface 212 of the first metal layer 21 is connected to the central portion of the electrical connecting element 12 by chemical means (e.g., PVD), and the bottom surface 202 of the first insulating layer 20 is connected to the periphery portion (e.g., the left side and the right side) of the electrical connecting element 12 by physical means (e.g., adhesion). Thus, a bonding force between the exposed portion (e.g., bonding pad) of the bottom surface 212 of the first metal layer 21 and the electrical connecting element 12 is greater than a bonding force between the bottom surface 202 of the first insulating layer 20 and the electrical connecting element 12.

Figure 7:
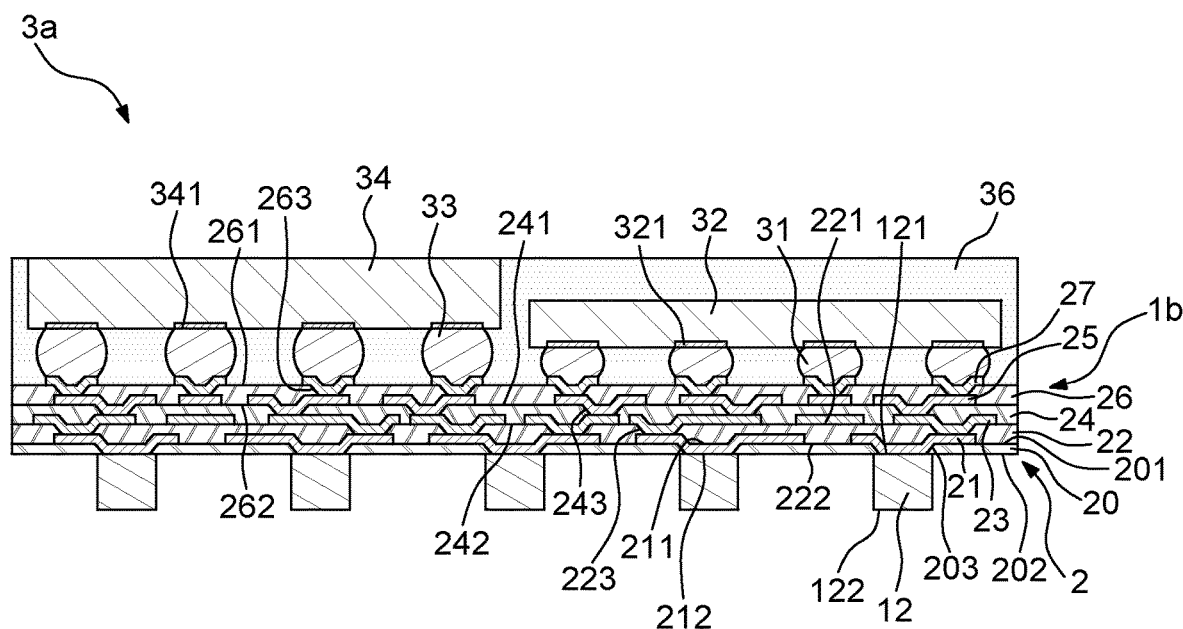
FIG. 7 illustrates a cross-sectional view of an electronic device according to some embodiments of the present disclosure.

FIG. 7 illustrates a cross-sectional view of an electronic device 3a according to some embodiments of the present disclosure. The electronic device 3a is similar to the electronic device 3 shown in FIG. 3, except that the seed layer 14 of the electronic device 1 is omitted. The electronic device 3a of FIG. 7 is a semiconductor package structure, and includes the electronic device 1b of FIG. 5, the first semiconductor die 32, the first interconnecting element 31, the second semiconductor die 34, the second interconnecting element 33 and the encapsulant 36. The electronic device 1b includes the wiring structure 2 and the electrical connecting element 12 as stated above. The first semiconductor die 32 is electrically connected to the third metal layer 25 of the wiring structure 2 through the first interconnecting element 31 and the UBM 27. The second semiconductor die 34 is electrically connected to the third metal layer 25 of the wiring structure 2 through the second interconnecting element 33 and the UBM 27. The encapsulant 36 is disposed on the fourth insulating layer 26, and encapsulates and covers the first semiconductor die 32, the first interconnecting element 31, the second semiconductor die 34, the second interconnecting element 33 and the UBM 27. A material of the encapsulant 36 may be a molding compound with or without fillers. The encapsulant 36 and the wiring structure 2 are singulated concurrently so that a side surface of the encapsulant 36 is substantially coplanar with a side surface of the wiring structure 2.

Figure 8:
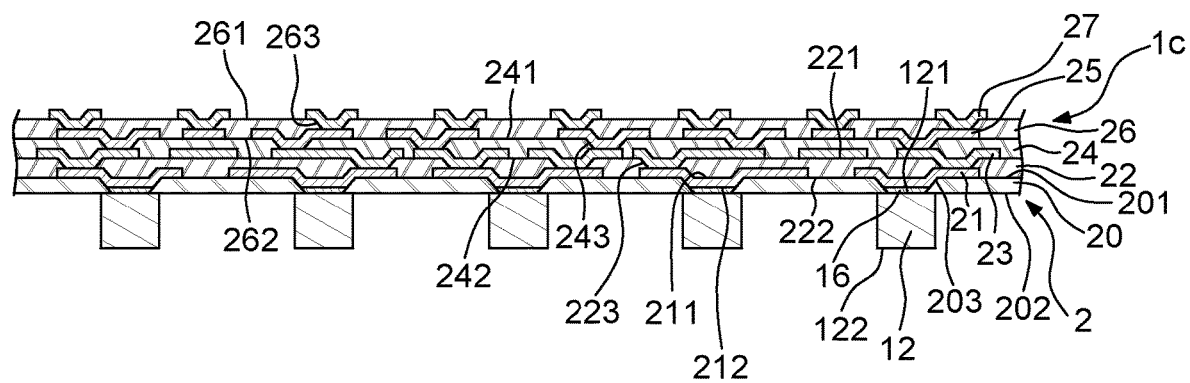
FIG. 8 illustrates a cross-sectional view of an electronic device according to some embodiments of the present disclosure.

FIG. 8 illustrates a cross-sectional view of an electronic device 1c according to some embodiments of the present disclosure. The electronic device 1c is similar to the electronic device 1b shown in FIG. 5, except that the electronic device 1c further includes a barrier layer 16 interposed between the electrical connecting element 12 and the bottom surface 212 of the first metal layer 21. The barrier layer 16 is disposed in the opening 203 of the first insulating layer 20, and a bottom surface of the barrier layer 16 is substantially coplanar with the bottom surface 202 of the first insulating layer 20. A material of the barrier layer 16 may include nickel that may be formed by physical vapor deposition (PVD). A thickness of the barrier layer 16 may be less than 1 μm. The barrier layer 16 can suppress the formation of the IMCs especially the formation of the $Cu_3Sn_4$ IMC, thus, increasing the reliability of the bonding between the electrical connecting element 12 and the first metal layer 21.

Figure 9:
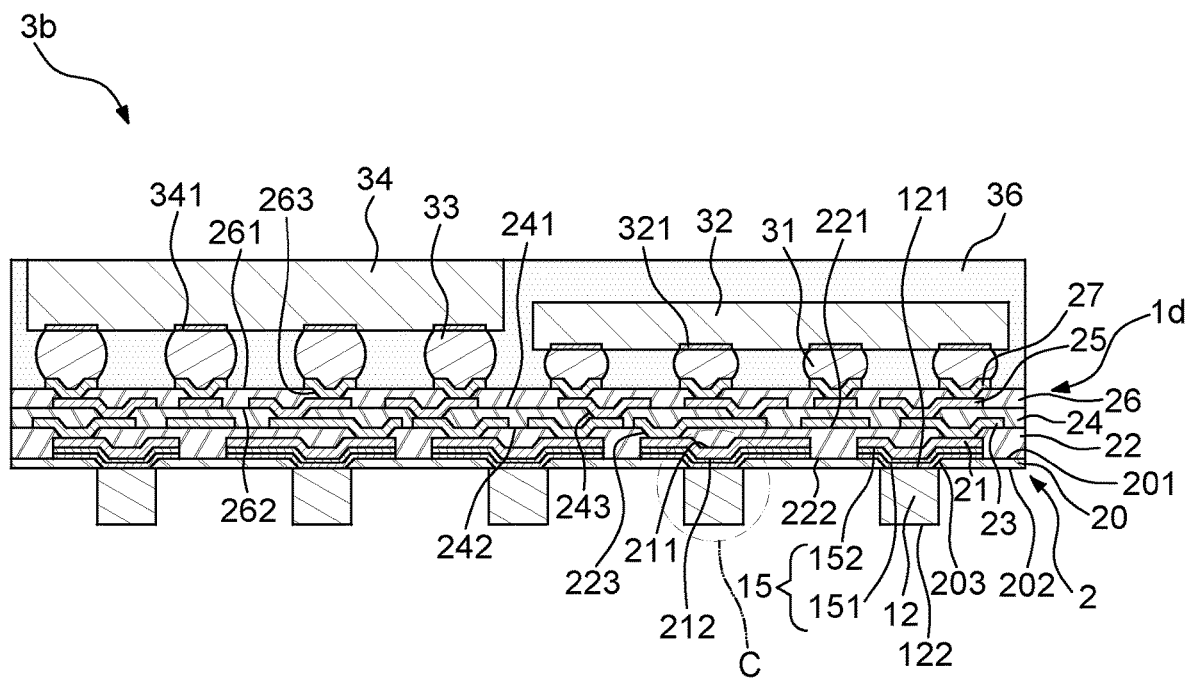
FIG. 9 illustrates a cross-sectional view of an electronic device according to some embodiments of the present disclosure.
Figure 10:
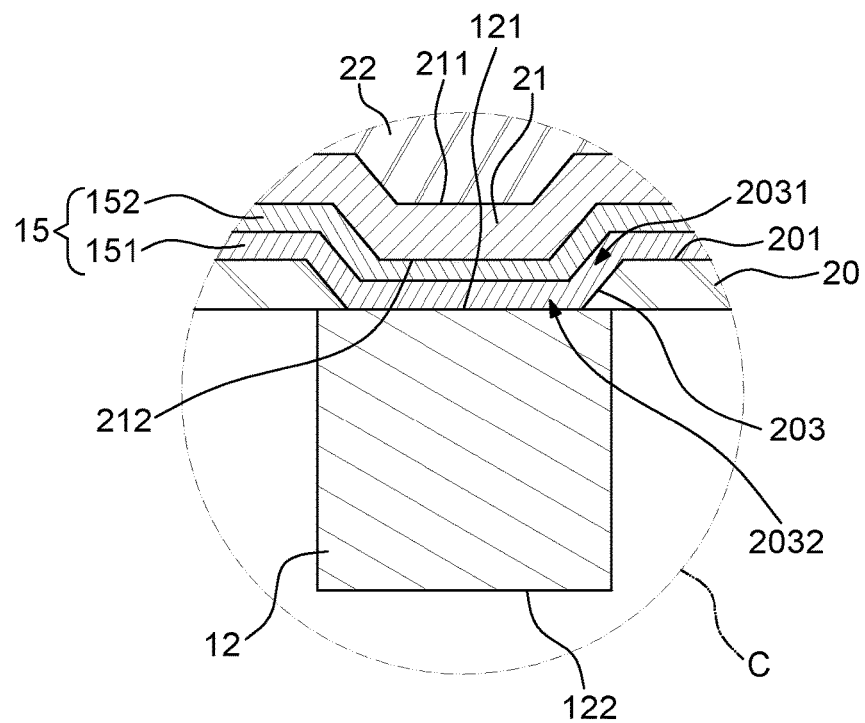
FIG. 10 illustrates an enlarged view of an area "C" shown in FIG. 9.

FIG. 9 illustrates a cross-sectional view of an electronic device 3b according to some embodiments of the present disclosure. FIG. 10 illustrates an enlarged view of an area "C" shown in FIG. 9. The electronic device 3b is a semiconductor package structure, and is similar to the electronic device 3a shown in FIG. 7, except for the structure of the electronic device 1d. The electronic device 1d of FIG. 9 further includes a seed layer 15 under the first metal layer 21. The layout and the pattern of the seed layer 15 is the same as the layout and the pattern of the first metal layer 21. The seed layer 15 is interposed between the first metal layer 21 and the first insulating layer 20. That is, the seed layer 15 is disposed on the top surface 201 and in the opening 203 of the first insulating layer 20. In addition, the seed layer 15 is interposed between the first metal layer 21 and the electrical connecting element 12. A bottom surface of the seed layer 15 is substantially coplanar with the bottom surface 202 of the first insulating layer 20. The seed layer 15 may include a first conductive layer 151 and a second conductive layer 152. A material of the first conductive layer 151 of the seed layer 15 includes titanium-tungsten (TiW) alloy that may be formed by physical vapor deposition (PVD). A material of the second conductive layer 152 of the seed layer 15 includes copper that may be formed by physical vapor deposition (PVD). A thickness of the first conductive layer 151 may be less than 1 µm, and a thickness of the second conductive layer 152 may be less than 1 µm. The first conductive layer 151 of the seed layer 15 contacts and/or is electrically connected to the electrical connecting element 12.

Figure 11:
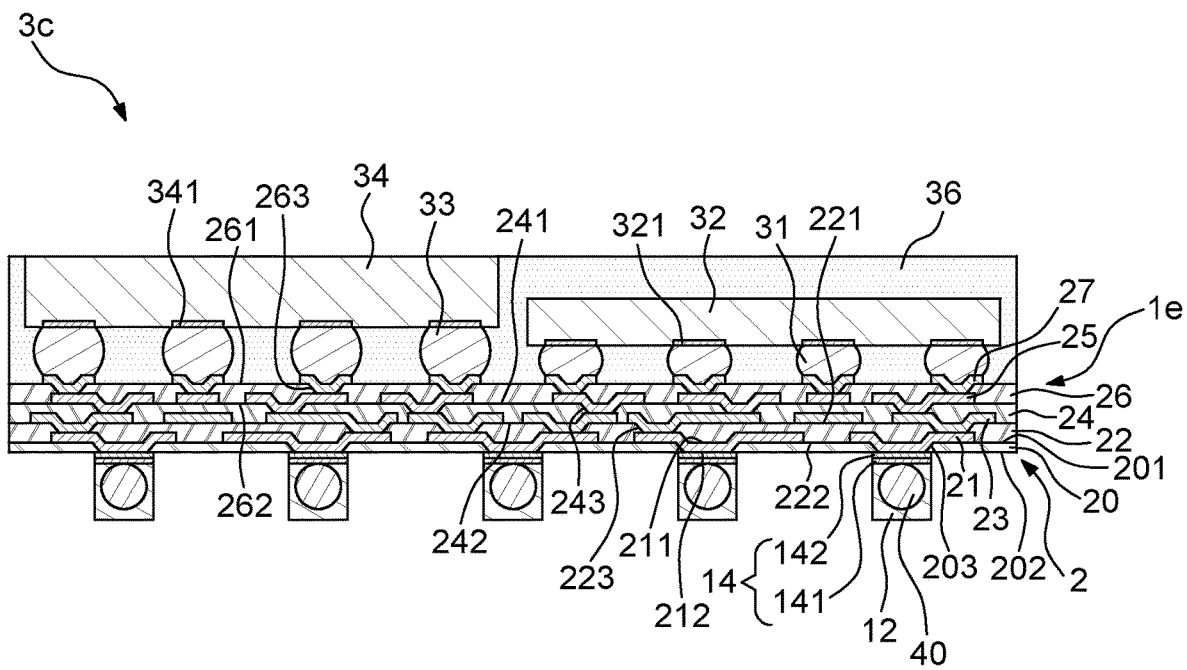
FIG. 11 illustrates a cross-sectional view of an electronic device according to some embodiments of the present disclosure.

FIG. 11 illustrates a cross-sectional view of an electronic device 3c according to some embodiments of the present disclosure. The electronic device 3c is a semiconductor package structure, and is similar to the electronic device 3 shown in FIG. 3, except for the structure of the electronic device 1e. The electronic device 1e of FIG. 11 further includes at least one solid core ball 40 disposed in the electrical connecting element 12. In some embodiments, the solid core ball 40 may be a copper core ball. As shown in FIG. 11, the top end of the solid core ball 40 may contact the first conductive layer 141 of the seed layer 14. The solid core ball 40 may be used as a standoff when the electronic device 3c is mounted to a mother board so as to prevent tilt.

Figure 12:
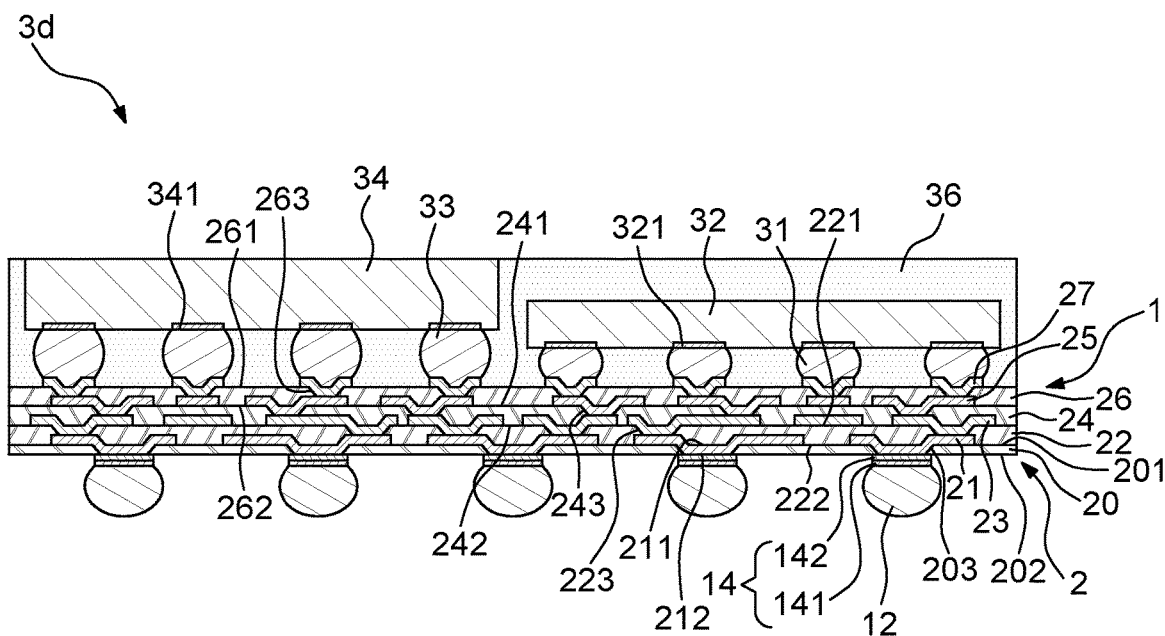
FIG. 12 illustrates a cross-sectional view of an electronic device according to some embodiments of the present disclosure.

FIG. 12 illustrates a cross-sectional view of an electronic device 3d according to some embodiments of the present disclosure. The electronic device 3d is a semiconductor package structure, and is similar to the electronic device 3 shown in FIG. 3, except for the structure of the electrical connecting element 12. Since a reflow process is conducted to the electronic device 3d of FIG. 12, the electrical connecting element 12 is melted to become a ball shape due to the cohesion force.

Figure 13:
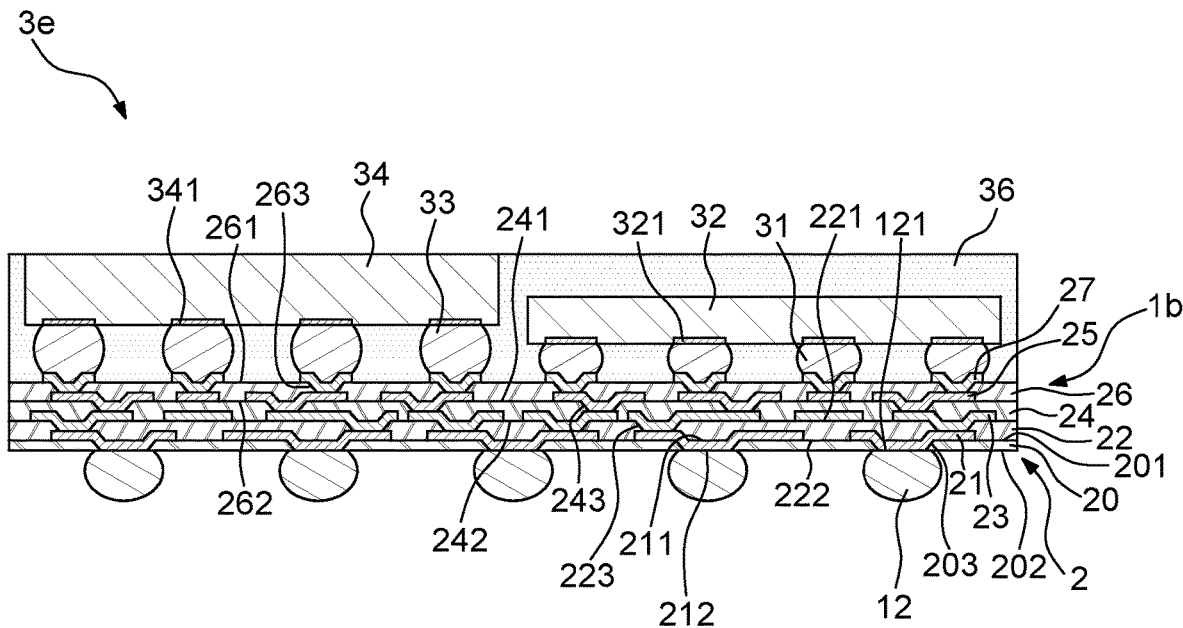
FIG. 13 illustrates a cross-sectional view of an electronic device according to some embodiments of the present disclosure.

FIG. 13 illustrates a cross-sectional view of an electronic device 3e according to some embodiments of the present disclosure. The electronic device 3e is a semiconductor package structure, and is similar to the electronic device 3a shown in FIG. 7, except for the structure of the electrical connecting element 12. Since a reflow process is conducted to the electronic device 3e of FIG. 13, the electrical connecting element 12 is melted to become a ball shape due to the cohesion force.

Figure 14:
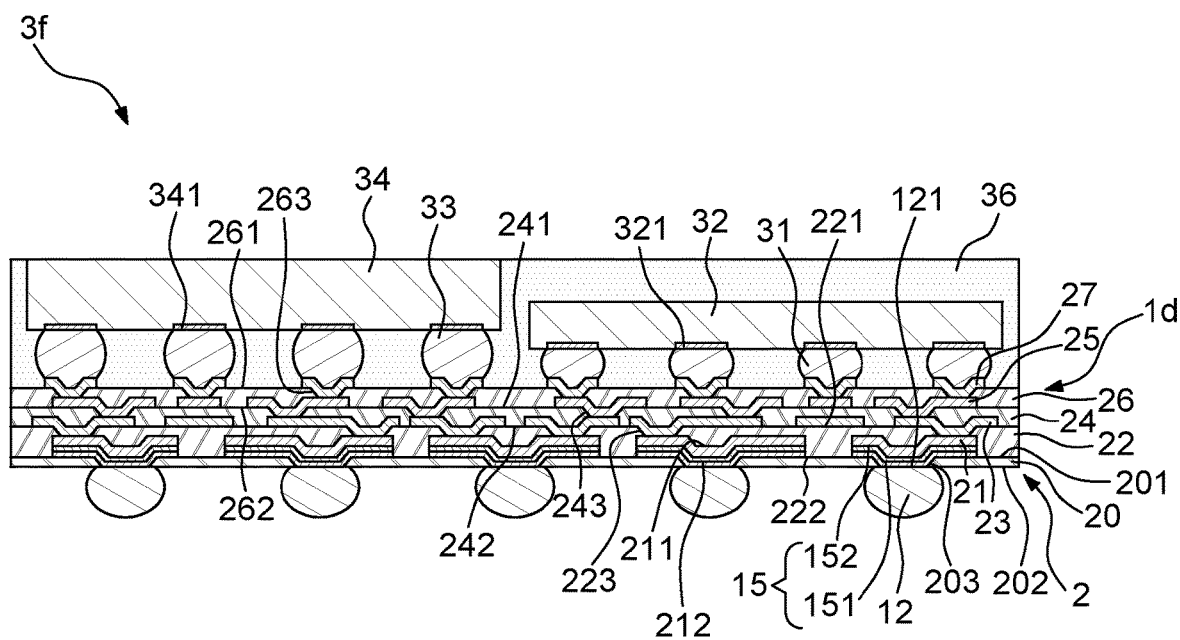
FIG. 14 illustrates a cross-sectional view of an electronic device according to some embodiments of the present disclosure.

FIG. 14 illustrates a cross-sectional view of an electronic device 3f according to some embodiments of the present disclosure. The electronic device 3f is a semiconductor package structure, and is similar to the electronic device 3b shown in FIG. 9, except for the structure of the electrical connecting element 12. Since a reflow process is conducted to the electronic device 3f of FIG. 14, the electrical connecting element 12 is melted to become a ball shape due to the cohesion force.

Figure 15:
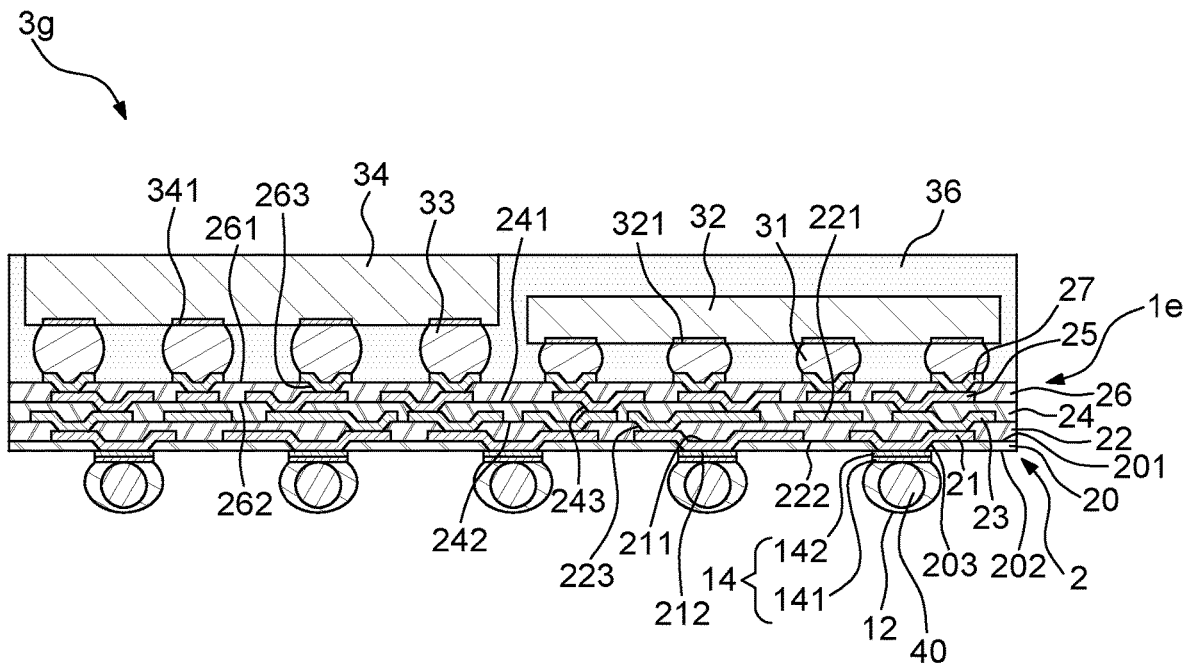
FIG. 15 illustrates a cross-sectional view of an electronic device according to some embodiments of the present disclosure.

FIG. 15 illustrates a cross-sectional view of an electronic device 3g according to some embodiments of the present disclosure. The electronic device 3g is a semiconductor package structure, and is similar to the electronic device 3c shown in FIG. 11, except for the structure of the electrical connecting element 12. Since a reflow process is conducted to the electronic device 3g of FIG. 15, the electrical connecting element 12 is melted to become a ball shape due to the cohesion force.

Figure 16:
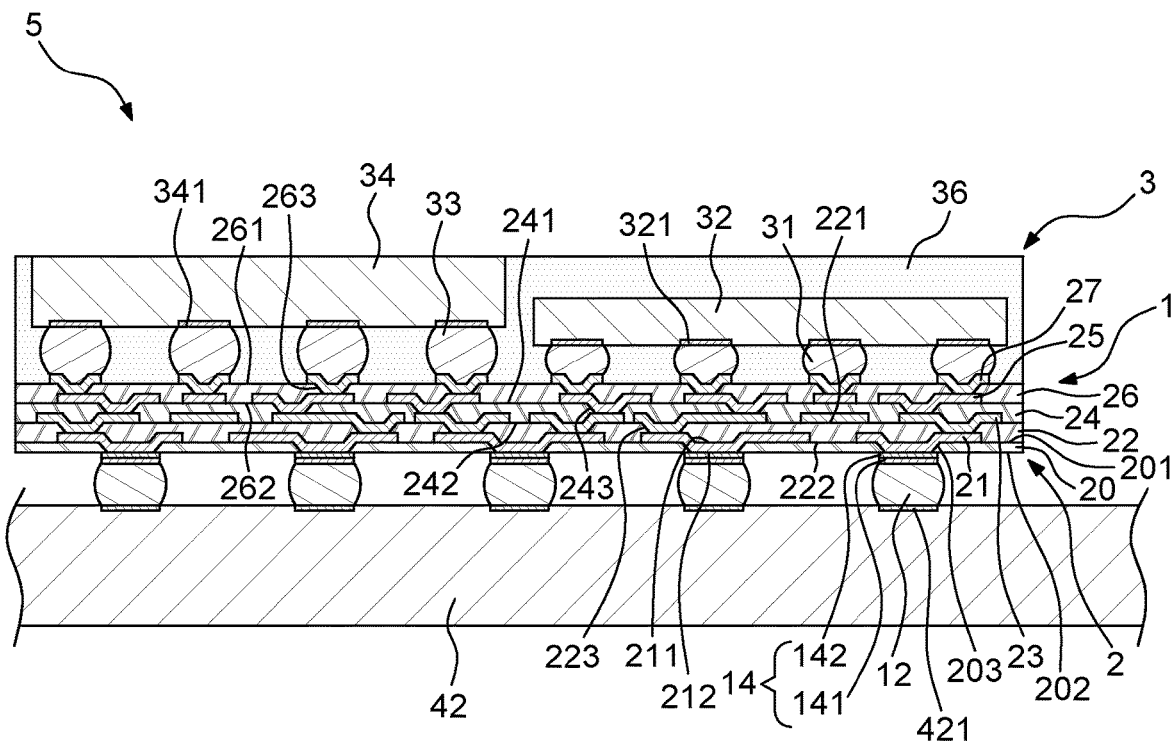
FIG. 16 illustrates a cross-sectional view of an assembly according to some embodiments of the present disclosure.

FIG. 16 illustrates a cross-sectional view of an assembly 5 according to some embodiments of the present disclosure. In the assembly 5, the electronic device 3 of FIG. 3 is mounted to a mother board 42. The mother board 42 includes a plurality of pads 421, and the electrical connecting elements 12 of the electronic device 3 contact the pads 421 of the mother board 42. Since the electrical connecting element 12 is in a shape of a rectangular column or a cylinder before a reflow process, the contact area between the electrical connecting element 12 and the pads 421 of the mother board 42 is larger than the contact area between a solder ball and the pads 421 of the mother board 42. Thus, the joint quality and reliability of the assembly 5 after the reflow process is increased.

FIG. 17 through FIG. 29 illustrate a method for manufacturing an electronic device 3 (e.g., a semiconductor package structure) according to some embodiments of the present disclosure. In some embodiments, the method is for manufacturing an electronic device such as the electronic device 3 (e.g., a semiconductor package structure) shown in FIG. 3.

Figure 17:
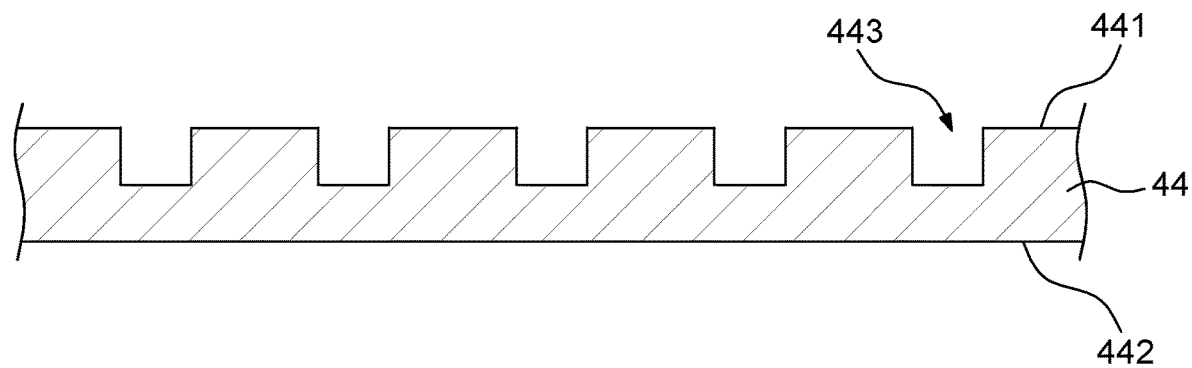
FIG. 17 illustrates one or more stages of an example of a method for manufacturing an electronic device according to some embodiments of the present disclosure.

Referring to FIG. 17, a carrier 44 is provided. The carrier 44 may be made of ceramic, silicon, glass or metal. The carrier 44 has a first surface 441 and a second surface 442 opposite to the first surface 441, and defines a plurality of openings 443 on the first surface 441. Each of the openings 443 is a blind hole that is recessed from the first surface 441 and does not extend through the carrier 44. The openings 443 may be formed by plasma etching, and the shape of the openings 443 may be in any shape. For example, the opening 443 may be circular of rectangular from a top view. In some embodiments, a gap between the openings 443 may be less than about 70 µm, about 60 µm, or about 50 µm, and an aspect ratio (depth/width) of the openings 443 may be greater than or equal to about 1, about 1.2, about 1.5, or about 2.

Figure 18:
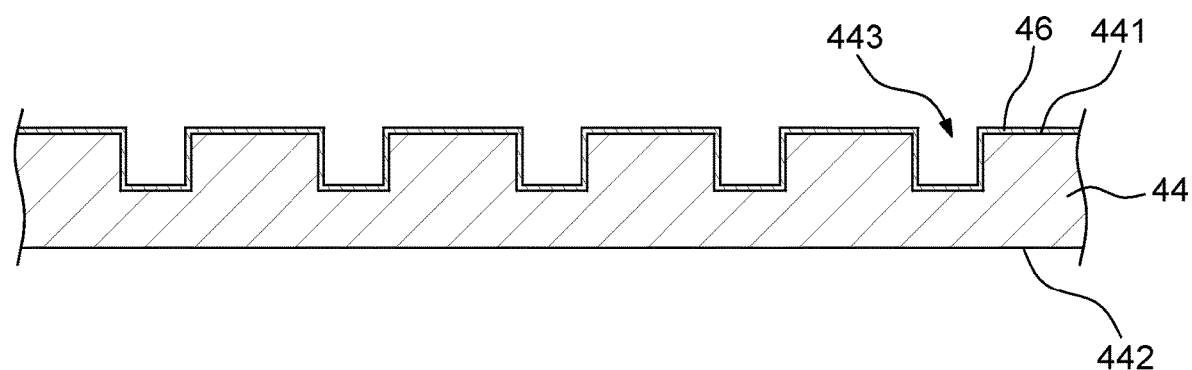
FIG. 18 illustrates one or more stages of an example of a method for manufacturing an electronic device according to some embodiments of the present disclosure.

Referring to FIG. 18, a release layer 46 is formed or disposed on the first surface 441 and in the openings 443 of the carrier 44 by, for example, coating.

Figure 19:
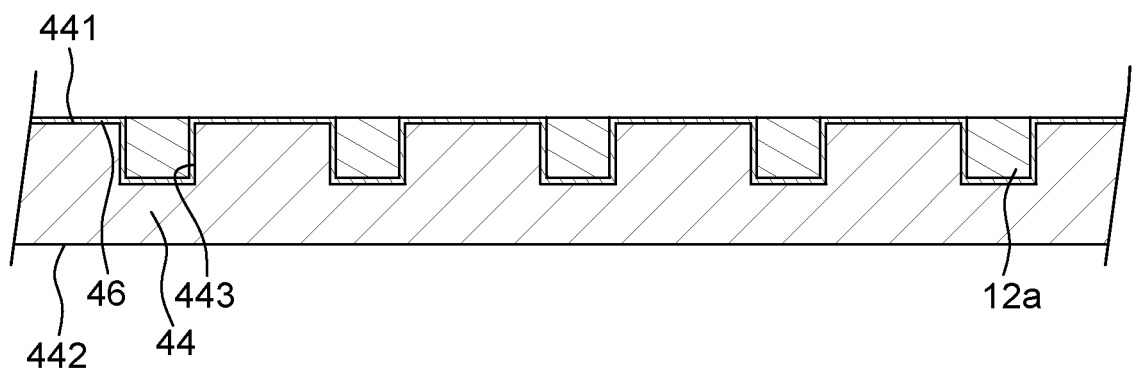
FIG. 19 illustrates one or more stages of an example of a method for manufacturing an electronic device according to some embodiments of the present disclosure.

Referring to FIG. 19, a conductive material 12a is formed or disposed on the release layer 46 in the openings 443 of the carrier 44 by, for example, printing. A material of the conductive material 12a includes a solder material such as silver-tin (AgSn) alloy. In some embodiments, a top surface of the conductive material 12a may be substantially coplanar with a top surface of the release layer 46 on the first surface 441 of the carrier 44.

Figure 20:
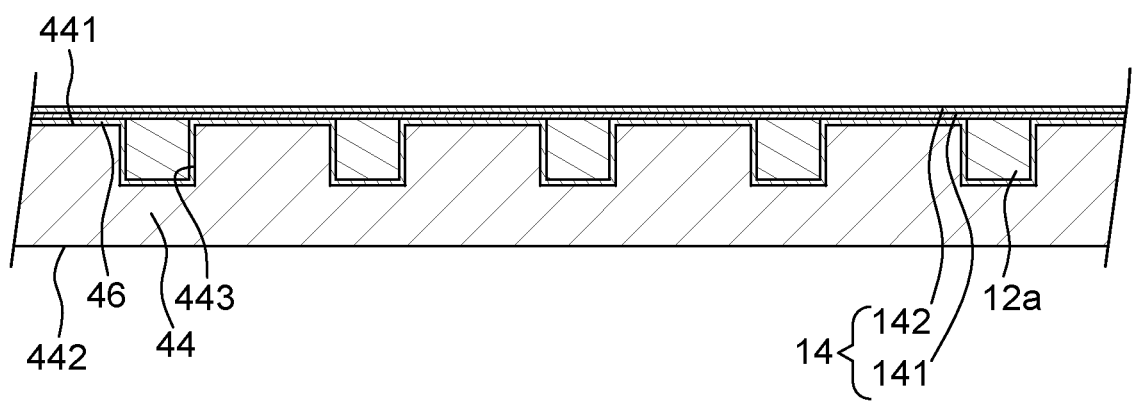
FIG. 20 illustrates one or more stages of an example of a method for manufacturing an electronic device according to some embodiments of the present disclosure.

Referring to FIG. 20, a seed layer 14 is formed or disposed on the conductive material 12a and on the release layer 46 that is on the first surface 441 of the carrier 44 by, for example, sputtering. In some embodiments, the seed layer 14 may include a first conductive layer 141 and a second conductive layer 142. A material of the first conductive layer 141 of the seed layer 14 includes titanium-tungsten (TiW) alloy that may be formed by physical vapor deposition (PVD). A material of the second conductive layer 142 of the seed layer 14 includes copper that may be formed on the first conductive layer 141 by physical vapor deposition (PVD). A thickness of the first conductive layer 141 may be less than 1 and a thickness of the second conductive layer 142 may be less than 1 µm. As shown in FIG. 20, the first conductive layer 141 of the seed layer 14 contacts and/or is electrically connected to the conductive material 12a.

Figure 21:
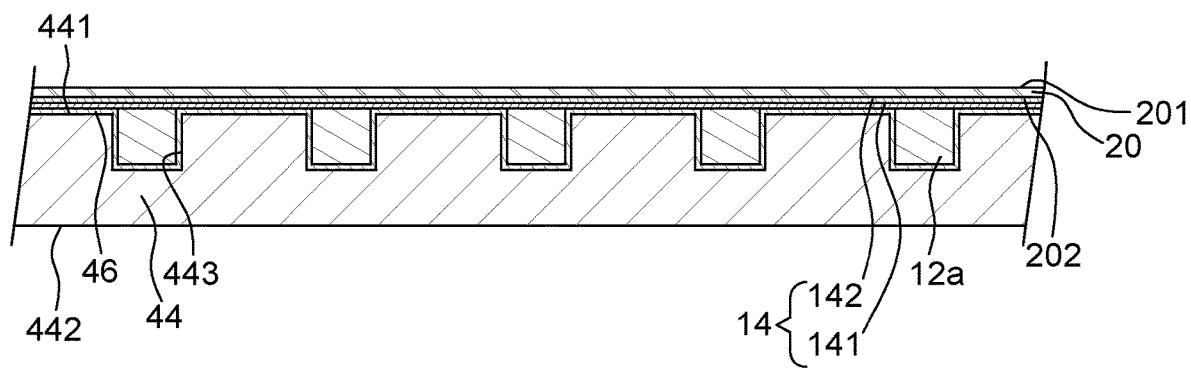
FIG. 21 illustrates one or more stages of an example of a method for manufacturing an electronic device according to some embodiments of the present disclosure.

Referring to FIG. 21 to FIG. 24, a wiring structure 2 is formed or disposed on the seed layer 14. Thus, the wiring structure 2 is formed or disposed on the carrier 44 and the conductive material 12a. Referring to FIG. 21, a first insulating layer 20 is formed or disposed on the second conductive layer 142 of the seed layer 14 by, for example, coating.

A material of the first insulating layer 20 may include an insulating material, a passivation material, a dielectric material or a solder resist material, such as, for example, a benzocyclobutene (BCB) based polymer or a polyimide (PI). In some embodiments, the first insulating layer 20 may include a cured photoimageable dielectric (PID) material, such as an epoxy or a PI including photoinitiators. A thickness of the first insulating layer 20 may be greater than about 5 µm. In some embodiments, the thickness of the first insulating layer 20 may be about 7 µm. The first insulating layer 20 has a top surface 201 and a bottom surface 202 opposite to the top surface 201.

Figure 22:
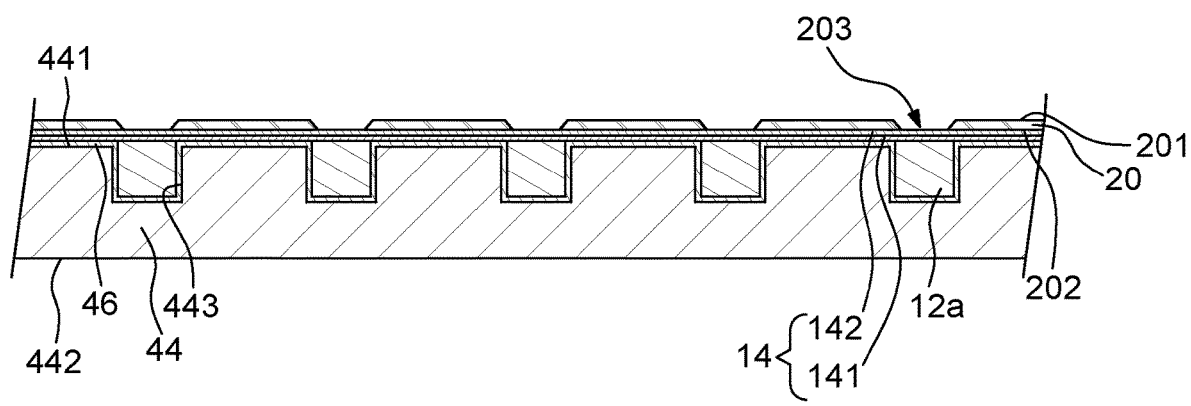
FIG. 22 illustrates one or more stages of an example of a method for manufacturing an electronic device according to some embodiments of the present disclosure.

Referring to FIG. 22, portions of the first insulating layer 20 are removed by, for example, photolithography, to form a plurality of openings 203 to expose portions of the seed layer 14. The opening 203 extends through the first insulating layer 20, that is, the opening 203 extends between the top surface 201 and the bottom surface 202. The position of the opening 203 may correspond to the position of the conductive material 12a. As shown in FIG. 22, the opening 203 is disposed right above the conductive material 12a. As shown in FIG. 2, the opening 203 of the first insulating layer 20 includes a top portion 2031 and a bottom portion 2032. The top portion 2031 has a first width $W_1$, and the bottom portion 2032 has a second width $W_2$. The first width $W_1$ of the top portion 2031 is greater than the second width $W_2$ of the bottom portion 2032, thus, the opening 203 tapers from the top portion 2031 to the bottom portion 2032. However, in other embodiment, the first width $W_1$ of the top portion 2031 may be substantially equal to the second width $W_2$ of the bottom portion 2032. A width of the electrical connecting element 12 is defined as a third width $W_3$. The second width $W_2$ of the bottom portion 2032 of the opening 203 is less than or equal to the third width $W_3$ of the electrical connecting element 12 (e.g., may be about 1.0 time, about 0.9 times less, about 0.8 times less, about 0.7 times less, or about 0.6 times less). For example, a ratio of ($W_2/W_3$) may be in a range of 1.0~0.8, 0.9~0.7, or 0.8~0.6.

Figure 23:
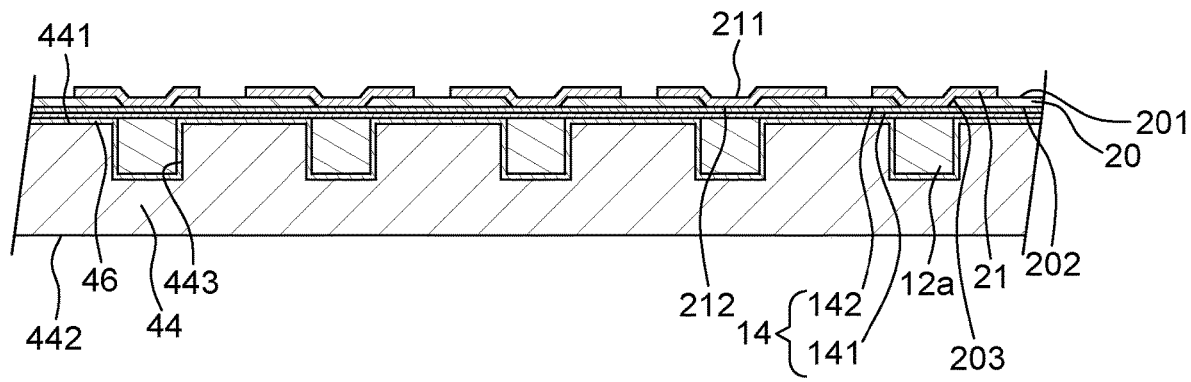
FIG. 23 illustrates one or more stages of an example of a method for manufacturing an electronic device according to some embodiments of the present disclosure.

Referring to FIG. 23, a first metal layer 21 is formed in the openings 203 of the first insulating layer 20 and on the exposed portions of the seed layer 14. The first metal layer 21 may be a patterned circuit structure (e.g., a redistribution layer (RDL)), and is disposed on the top surface 201 of the first insulating layer 20 and in the opening 203 of the first insulating layer 20. A seed layer (not shown) may be further included between the first metal layer 21 and the first insulating layer 20. A material of the first metal layer 21 may include copper, and may be formed by, for example, plating. A thickness of the first metal layer 21 may be greater than or equal to the thickness of the first insulating layer 20. In some embodiments, the thickness of the first insulating layer 20 may be greater than about 5 µm. The first metal layer 21 has a top surface 211 and a bottom surface 212 opposite to the top surface 211. The bottom surface 212 of the first metal layer 21 is exposed from the bottom surface 202 of the first insulating layer 20, and is substantially coplanar with the bottom surface 202 of the first insulating layer 20. The exposed portion of the bottom surface 212 of the first metal layer 21 forms a bonding pad for external connection.

As shown in FIG. 23, the central portion of the seed layer 14 may contact the entire exposed portion (e.g., bonding pad) of the bottom surface 212 of the first metal layer 21, and the periphery portion (e.g., the left side and the right side) of the seed layer 14 may contact the bottom surface 202 of the first insulating layer 20. It is noted that the entire exposed portion (e.g., bonding pad) of the bottom surface 212 of the first metal layer 21 is connected to the central portion of the seed layer 14 by chemical means (e.g., PVD), and the bottom surface 202 of the first insulating layer 20 is connected to the periphery portion (e.g., the left side and the right side) of the seed layer 14 by physical means (e.g., adhesion). Thus, a bonding force between the exposed portion (e.g., bonding pad) of the bottom surface 212 of the first metal layer 21 and the seed layer 14 is greater than a bonding force between the bottom surface 202 of the first insulating layer 20 and the seed layer 14.

Meanwhile, the conductive material 12a is attached to and electrically connected to the bottom surface 212 of the first metal layer 21 through the seed layer 14. As shown in FIG. 23, the conductive material 12a is attached to and electrically connected to the first conductive layer 141 of the seed layer 14. That is, the conductive material 12a protrudes from a bottom surface of the seed layer 14 and the bottom surface 202 of the first insulating layer 20. Since the Young's modulus of the carrier 44 is much greater than the first insulating layer 20, the carrier 44 can hold the first insulating layer 20. Thus, no warpage will occur to the first insulating layer 20, and the exposed portion (e.g., bonding pad) of the bottom surface 212 of the first metal layer 21 will not shift, and will be disposed on the predetermined position. That is, the exposed portion (e.g., bonding pad) of the bottom surface 212 of the first metal layer 21 can be disposed above the conductive material 12a precisely.

Figure 24:
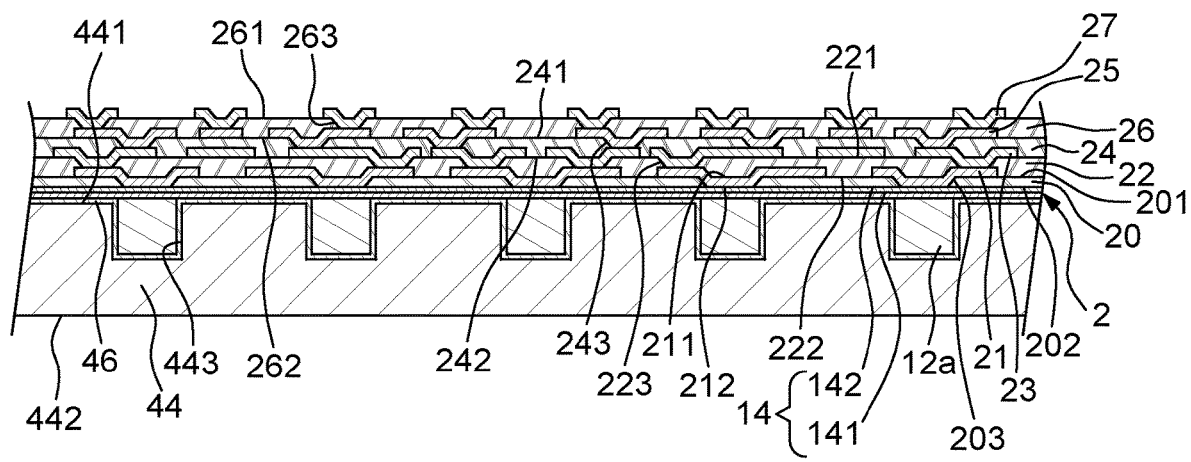
FIG. 24 illustrates one or more stages of an example of a method for manufacturing an electronic device according to some embodiments of the present disclosure.

Referring to FIG. 24, a second insulating layer 22, a second metal layer 23, a third insulating layer 24, a third metal layer 25, a fourth insulating layer 26, at least one under bump metallization (UBM) 27 are formed on the first insulating layer 20 and the first metal layer 21 subsequently, so as to form the wiring structure 2. It is noted that the conductive material 12a and the seed layer 14 are formed before the formation of the wiring structure 2, and the bonding between the exposed portion (e.g., bonding pad) of the bottom surface 212 of the first metal layer 21 and the seed layer 14 (and the conductive material 12a) is formed before a molding process. Thus, the vertical central axis of the conductive material 12a and the seed layer 14 can be substantially aligned with the central axis of the exposed portion (e.g., bonding pad) of the bottom surface 212 of the first metal layer 21. In addition, even a warpage occurs to the wiring structure 2, the conductive material 12a and the seed layer 14 may shift or move together with the exposed portion (e.g., bonding pad) of the bottom surface 212 of the first metal layer 21. Thus, the yield rate of the bonding between the conductive material 12a and the wiring structure 2 is improved. Further, the size of the exposed portion (e.g., bonding pad) of the bottom surface 212 of the first metal layer 21 does not need to be enlarged. In some embodiments, a gap between the conductive material 12a may be less than about 70 µm, about 60 µm, or about 50 µm, and an aspect ratio (thickness/width) of the conductive material 12a may be greater than or equal to about 1, about 1.2, about 1.5, or about 2.

As stated above, the wiring structure 2 includes four insulating layers (or passivation layers) and three metal layers, and is referred to as a "4P3M" structure. It is noted that the wiring structure 2 may be a "5P4M" structure that includes five insulating layers (or passivation layers) and four metal layers, a "5P5M" structure that includes five insulating layers (or passivation layers) and five metal layers, or a "1P1M" structure that includes one insulating layer (or passivation layer) and one metal layer.

In some embodiments, if the carrier 44 and the release layer 46 are removed, and portions of the seed layer 14 that are not covered by the conductive material 12a are removed by, for example, etching, the electronic device 1 of FIG. 1 is obtained. It is noted that the conductive material 12*a* becomes the electrical connecting element 12. In some embodiments, if a barrier layer 16 (FIG. 4) is formed on the conductive material 12*a* before the formation of the seed layer 14 (e.g., before the stage of FIG. 20), the electronic device 1*a* of FIG. 4 is obtained.

Figure 25:
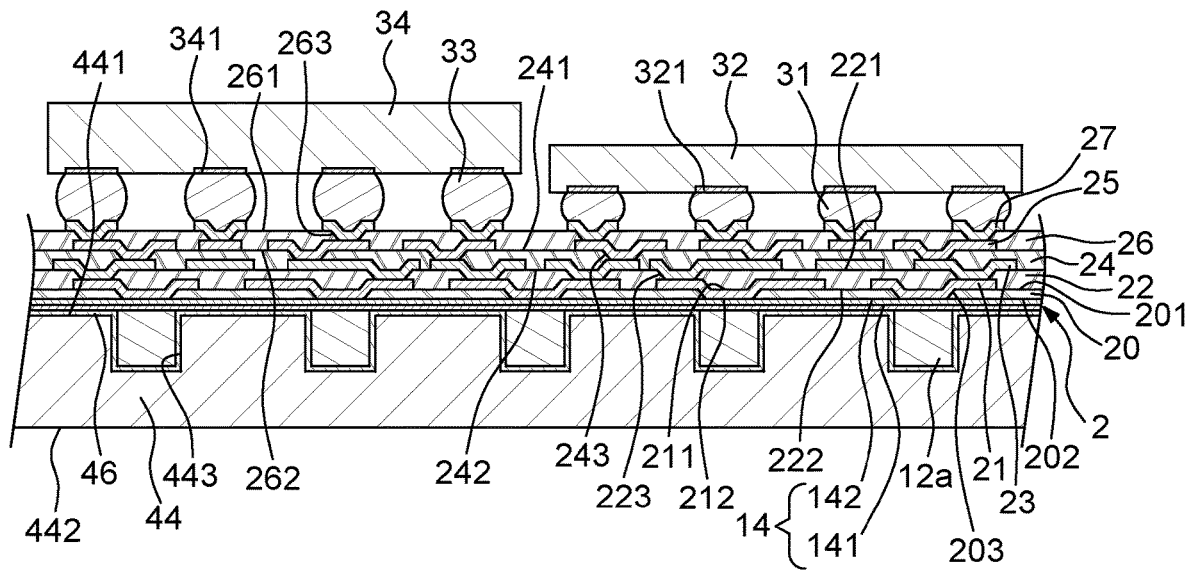
FIG. 25 illustrates one or more stages of an example of a method for manufacturing an electronic device according to some embodiments of the present disclosure.

Referring to FIG. 25, a first semiconductor die 32 and a second semiconductor die 34 are electrically connected to the wiring structure 2. The function and the size of the first semiconductor die 32 may be the same as or different from the function and the size of the second semiconductor die 34. The first semiconductor die 32 is electrically connected to the third metal layer 25 of the wiring structure 2 through the first interconnecting element 31 and the UBM 27 by clip chip bonding. For example, the first semiconductor die 32 includes at least one first bump pad 321. The first interconnecting element 31 is disposed on the UBM 27 and connected to the first bump pad 321. In some embodiments, the first interconnecting element 31 may be formed of a pre-solder or a solder ball. Similarly, the second semiconductor die 34 is electrically connected to the third metal layer 25 of the wiring structure 2 through the second interconnecting element 33 and the UBM 27 by clip chip bonding. For example, the second semiconductor die 34 includes at least one second bump pad 341. The second interconnecting element 33 is disposed on the UBM 27 and connected to the second bump pad 341. In some embodiments, the second interconnecting element 33 may be formed of a pre-solder or a solder ball.

Figure 26:
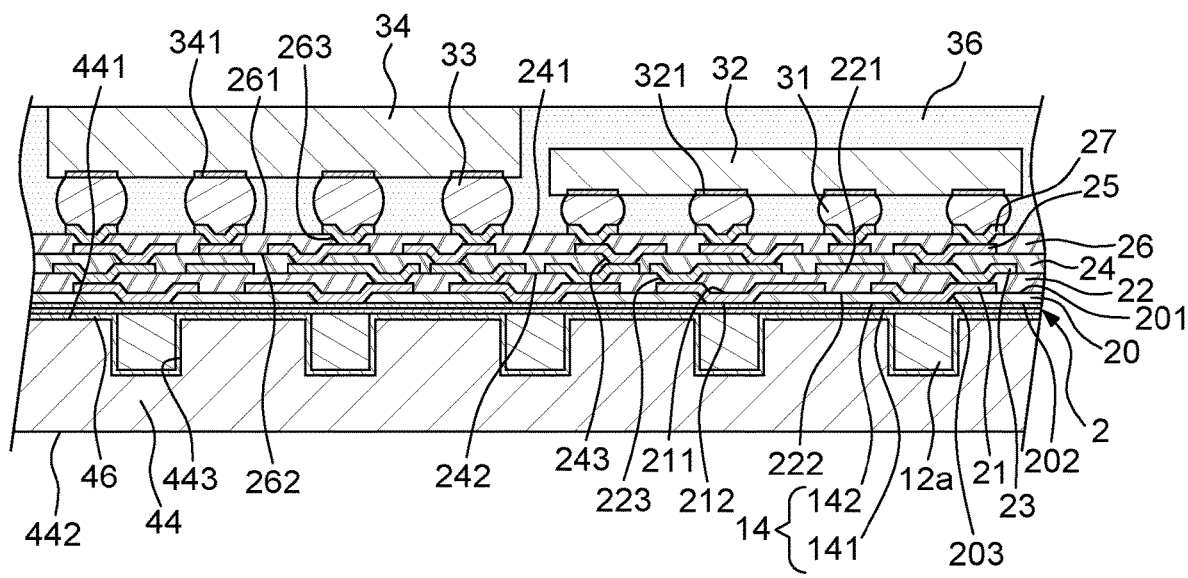
FIG. 26 illustrates one or more stages of an example of a method for manufacturing an electronic device according to some embodiments of the present disclosure.

Referring to FIG. 26, an encapsulant 36 is formed or disposed on the fourth insulating layer 26 of the wiring structure 2 to encapsulate and cover the first semiconductor die 32, the first interconnecting element 31, the second semiconductor die 34, the second interconnecting element 33 and the UBM 27. A material of the encapsulant 36 may be a molding compound with or without fillers.

Figure 27:
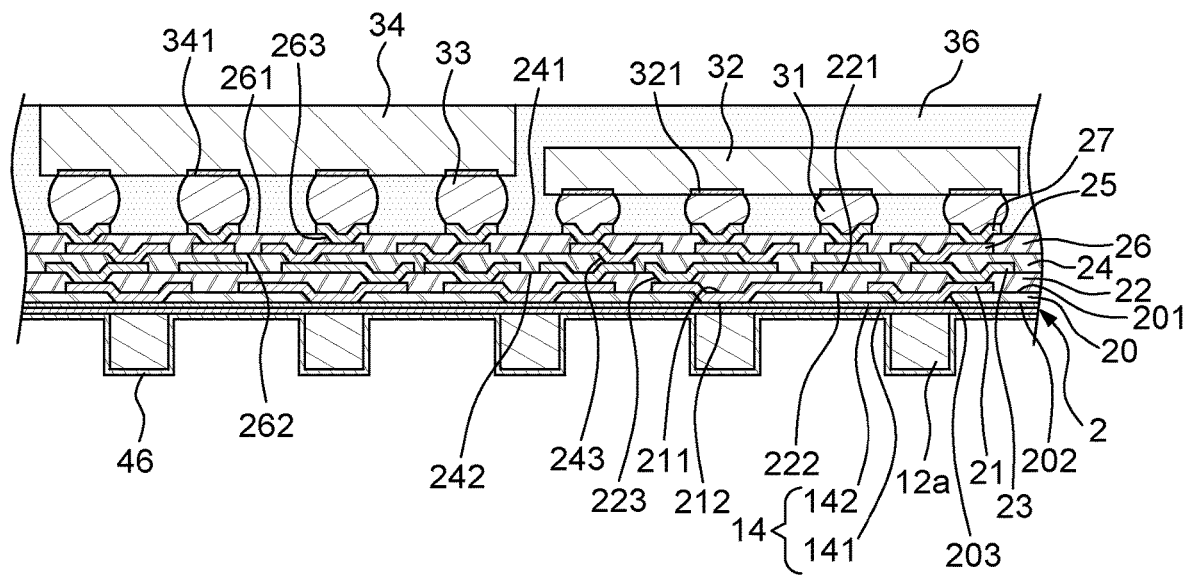
FIG. 27 illustrates one or more stages of an example of a method for manufacturing an electronic device according to some embodiments of the present disclosure.

Referring to FIG. 27, the carrier 44 is removed. Meanwhile, even a warpage occurs to the wiring structure 2 and the encapsulant 36, the conductive material 12*a* and the seed layer 14 may shift or move together with the exposed portion (e.g., bonding pad) of the bottom surface 212 of the first metal layer 21. Thus, the yield rate of the bonding between the conductive material 12*a* and the wiring structure 2 is improved.

Figure 28:
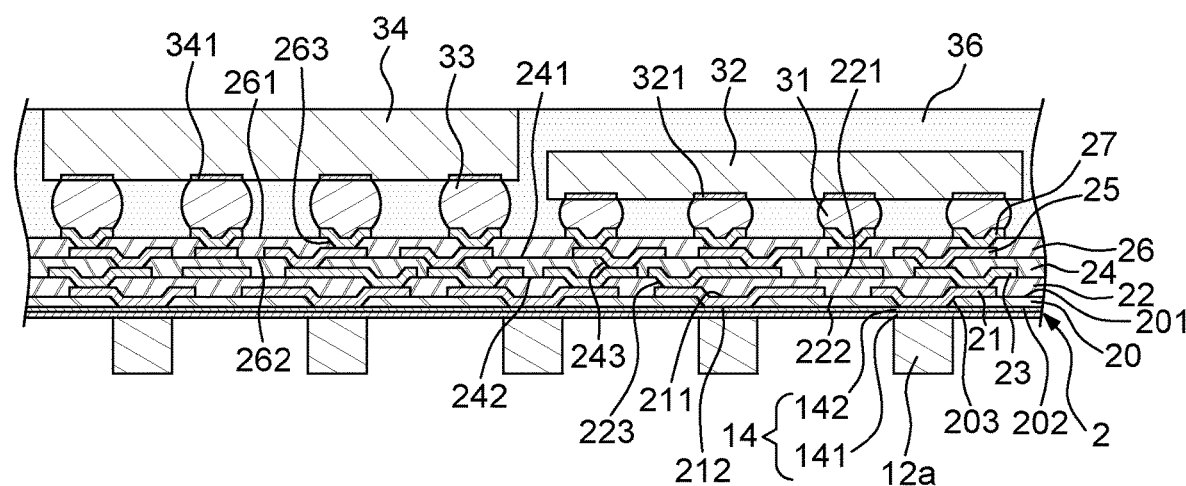
FIG. 28 illustrates one or more stages of an example of a method for manufacturing an electronic device according to some embodiments of the present disclosure.

Referring to FIG. 28, the release layer 46 is removed.

Figure 29:
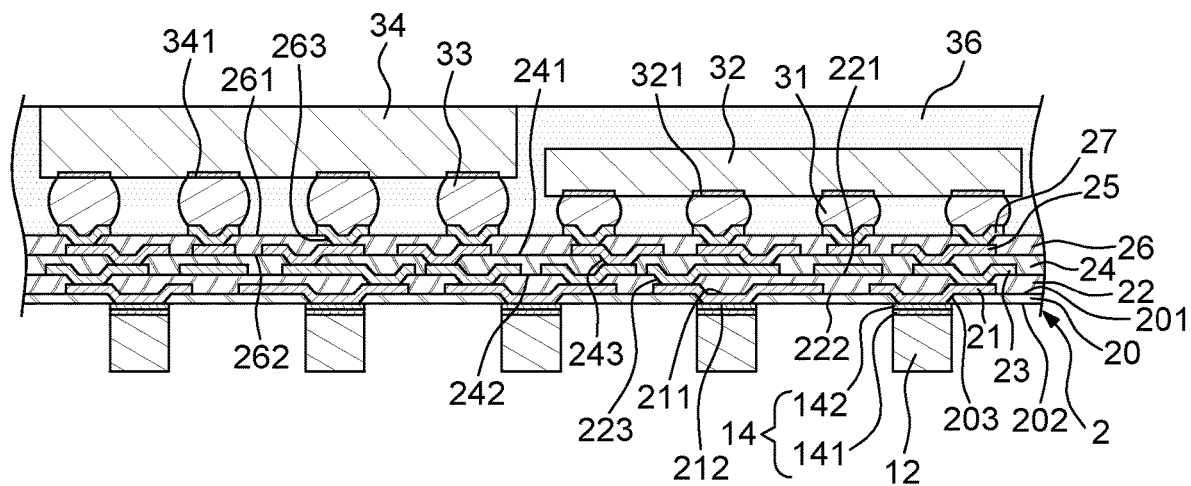
FIG. 29 illustrates one or more stages of an example of a method for manufacturing an electronic device according to some embodiments of the present disclosure.

Referring to FIG. 29, portions of the seed layer 14 that are not covered by the conductive material 12*a* are removed by, for example, etching. Meanwhile, the conductive material 12*a* becomes the electrical connecting element 12. Then, a singulation process is conducted so as to obtain the electronic device 3 (e.g., a semiconductor package structure) as shown in FIG. 3. Meanwhile, the encapsulant 36 and the wiring structure 2 are singulated concurrently so that a side surface of the encapsulant 36 is substantially coplanar with a side surface of the wiring structure 2. It is noted that, if a reflow process is conducted to the electronic device 3 of FIG. 3, the electrical connecting element 12 (e.g., the conductive material 12*a*) is reflowed and melted to become a ball shape due to the cohesion force, so as to obtain the electronic device 3*d* (e.g., a semiconductor package structure) as shown in FIG. 12.

FIG. 30 through FIG. 41 illustrate a method for manufacturing an electronic device 3*a* (e.g., a semiconductor package structure) according to some embodiments of the present disclosure. In some embodiments, the method is for manufacturing an electronic device such as the electronic device 3*a* (e.g., a semiconductor package structure) shown in FIG. 7.

Figure 30:
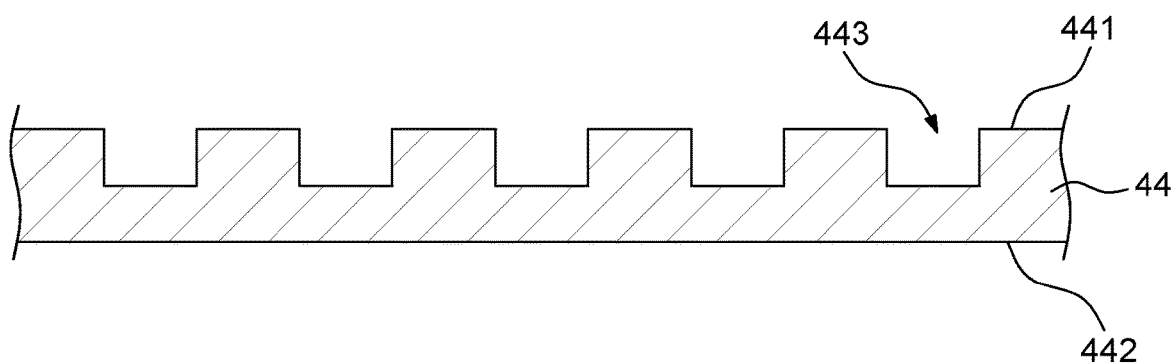
FIG. 30 illustrates one or more stages of an example of a method for manufacturing an electronic device according to some embodiments of the present disclosure.

Referring to FIG. 30, a carrier 44 is provided. The carrier 44 may be made of ceramic, silicon, glass or metal. The carrier 44 has a first surface 441 and a second surface 442 opposite to the first surface 441, and defines a plurality of openings 443 on the first surface 441. Each of the openings 443 is a blind hole that is recessed from the first surface 441 and does not extend through the carrier 44.

Figure 31:
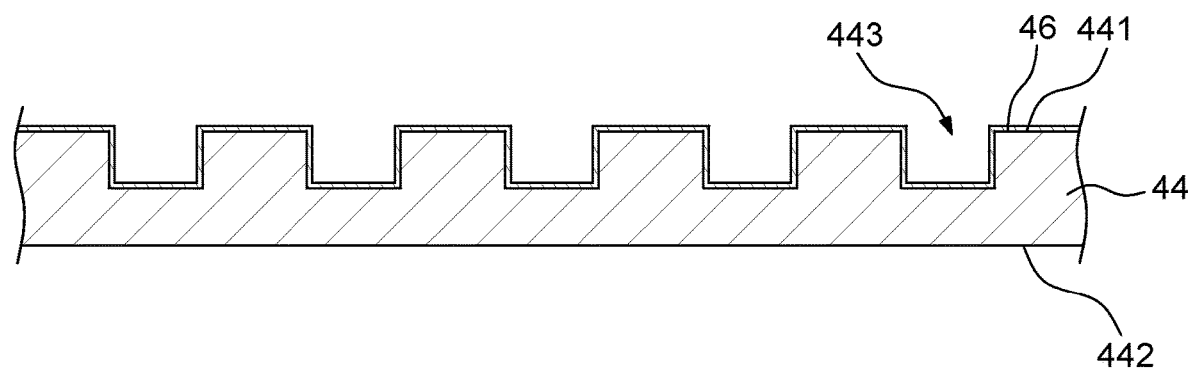
FIG. 31 illustrates one or more stages of an example of a method for manufacturing an electronic device according to some embodiments of the present disclosure.

Referring to FIG. 31, a release layer 46 is formed or disposed on the first surface 441 and in the openings 443 of the carrier 44 by, for example, coating.

Figure 32:
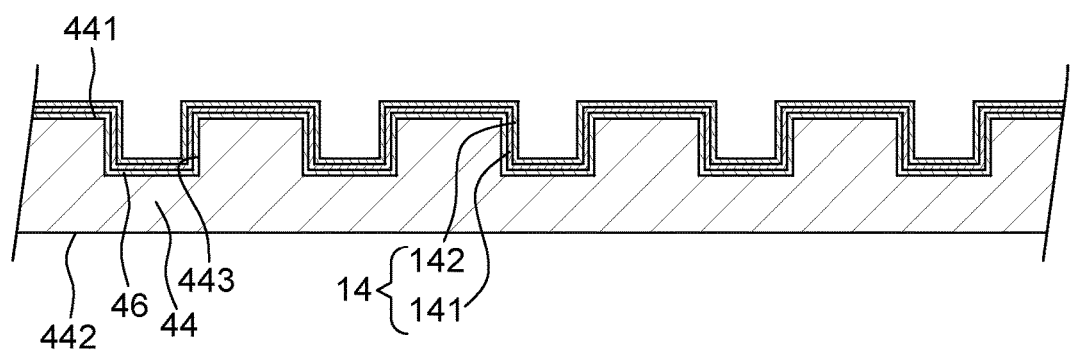
FIG. 32 illustrates one or more stages of an example of a method for manufacturing an electronic device according to some embodiments of the present disclosure.

Referring to FIG. 32, a seed layer 14 is formed or disposed on the release layer 46 that is on the first surface 441 and in the openings 443 of the carrier 44 by, for example, sputtering. In some embodiments, the seed layer 14 may include a first conductive layer 141 and a second conductive layer 142. A material of the first conductive layer 141 of the seed layer 14 includes titanium-tungsten (TiW) alloy that may be formed by physical vapor deposition (PVD). A material of the second conductive layer 142 of the seed layer 14 includes copper that may be formed on the first conductive layer 141 by physical vapor deposition (PVD).

Figure 33:
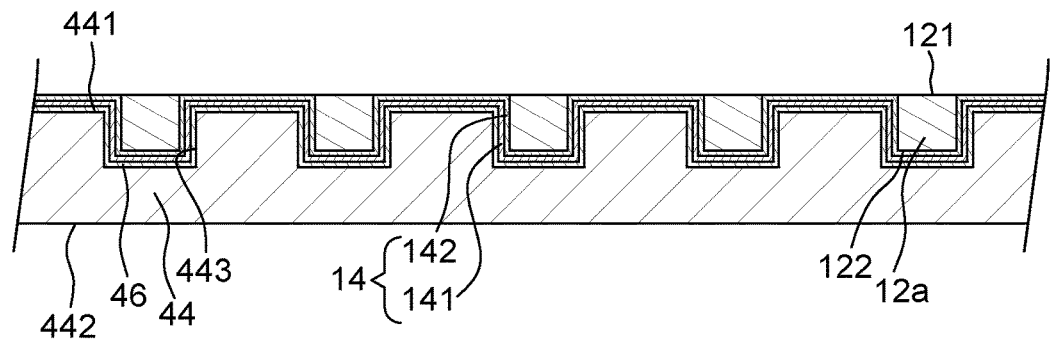
FIG. 33 illustrates one or more stages of an example of a method for manufacturing an electronic device according to some embodiments of the present disclosure.

Referring to FIG. 33, a conductive material 12*a* is formed or disposed on the seed layer 14 in the openings 443 of the carrier 44 by, for example, electroplating. A material of the conductive material 12*a* includes a solder material such as silver-tin (AgSn) alloy. In some embodiments, a top surface 121 of the conductive material 12*a* may be substantially coplanar with a top surface of the seed layer 14 on the first surface 441 of the carrier 44.

Figure 34:
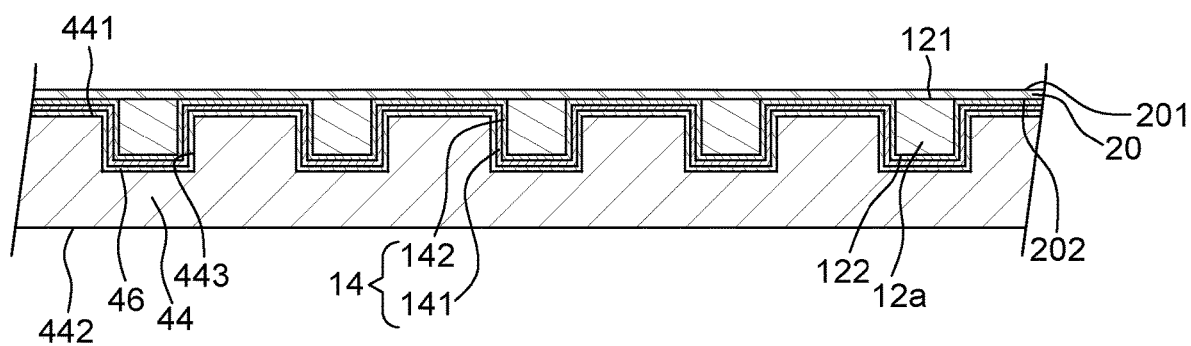
FIG. 34 illustrates one or more stages of an example of a method for manufacturing an electronic device according to some embodiments of the present disclosure.

Referring to FIG. 34 to FIG. 37, a wiring structure 2 is formed or disposed on the seed layer 14 and the conductive material 12*a*. Referring to FIG. 34, a first insulating layer 20 is formed or disposed on the second conductive layer 142 of the seed layer 14 and the conductive material 12*a* by, for example, coating. The first insulating layer 20 has a top surface 201 and a bottom surface 202 opposite to the top surface 201. The top surface 121 of the conductive material 12*a* may be substantially coplanar with the bottom surface 202 of the first insulating layer 20.

Figure 35:
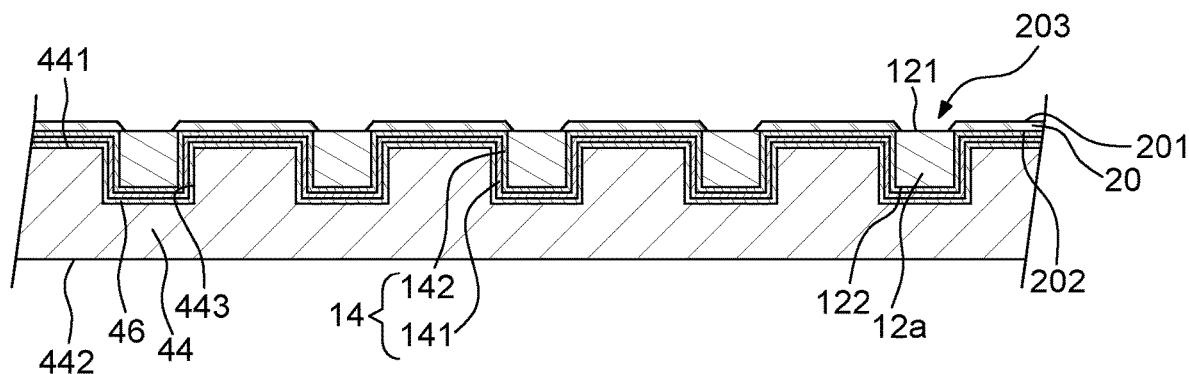
FIG. 35 illustrates one or more stages of an example of a method for manufacturing an electronic device according to some embodiments of the present disclosure.

Referring to FIG. 35, portions of the first insulating layer 20 are removed by, for example, photolithography, to form a plurality of openings 203 to expose portions of the conductive material 12*a*. The opening 203 extends through the first insulating layer 20, that is, the opening 203 extends between the top surface 201 and the bottom surface 202. The position of the opening 203 may correspond to the position of the conductive material 12*a*. As shown in FIG. 35, the opening 203 is disposed right above the conductive material 12*a*.

Figure 36:
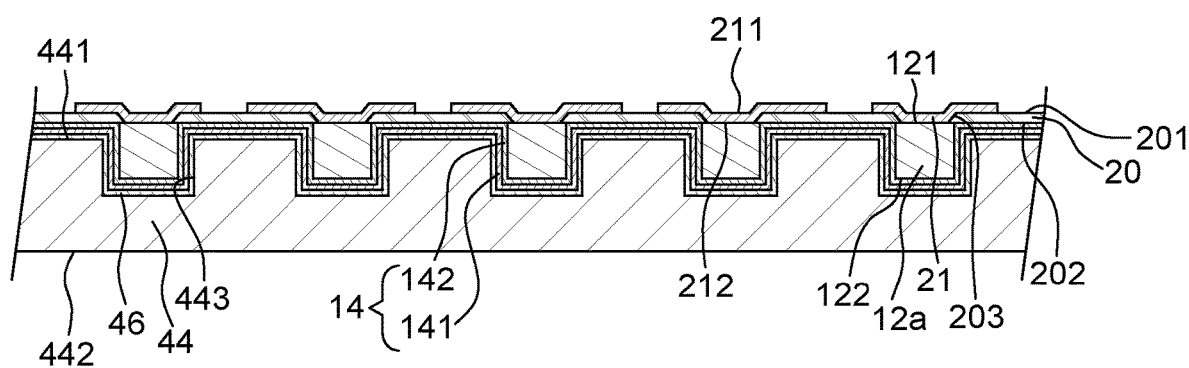
FIG. 36 illustrates one or more stages of an example of a method for manufacturing an electronic device according to some embodiments of the present disclosure.

Referring to FIG. 36, a first metal layer 21 is formed in the openings 203 of the first insulating layer 20 and on the exposed portions of the conductive material 12*a*. The first metal layer 21 may be a patterned circuit structure (e.g., a redistribution layer (RDL)), and is disposed on the top surface 201 of the first insulating layer 20 and in the opening 203 of the first insulating layer 20. The first metal layer 21 has a top surface 211 and a bottom surface 212 opposite to the top surface 211. The bottom surface 212 of the first metal layer 21 is exposed from the bottom surface 202 of the first insulating layer 20, and contacts the top surface 121 of the conductive material 12*a*.

As shown in FIG. 36, the central portion of the conductive material 12*a* may contact the entire exposed portion (e.g., bonding pad) of the bottom surface 212 of the first metal layer 21, and the periphery portion (e.g., the left side and the right side) of the conductive material 12a may contact the bottom surface 202 of the first insulating layer 20. It is noted that the entire exposed portion (e.g., bonding pad) of the bottom surface 212 of the first metal layer 21 is connected to the central portion of the conductive material 12a by chemical means (e.g., PVD), and the bottom surface 202 of the first insulating layer 20 is connected to the periphery portion (e.g., the left side and the right side) of the conductive material 12a by physical means (e.g., adhesion). Thus, a bonding force between the exposed portion (e.g., bonding pad) of the bottom surface 212 of the first metal layer 21 and the conductive material 12a is greater than a bonding force between the bottom surface 202 of the first insulating layer 20 and the conductive material 12a.

Meanwhile, the conductive material 12a is attached to and electrically connected to the bottom surface 212 of the first metal layer 21 directly. That is, the conductive material 12a protrudes from the bottom surface 202 of the first insulating layer 20. Since the Young's modulus of the carrier 44 is much greater than the first insulating layer 20, the carrier 44 can hold the first insulating layer 20. Thus, no warpage will occur to the first insulating layer 20, and the exposed portion (e.g., bonding pad) of the bottom surface 212 of the first metal layer 21 will not shift, and will be disposed on the predetermined position. That is, the exposed portion (e.g., bonding pad) of the bottom surface 212 of the first metal layer 21 can be disposed on the conductive material 12a precisely.

Figure 37:
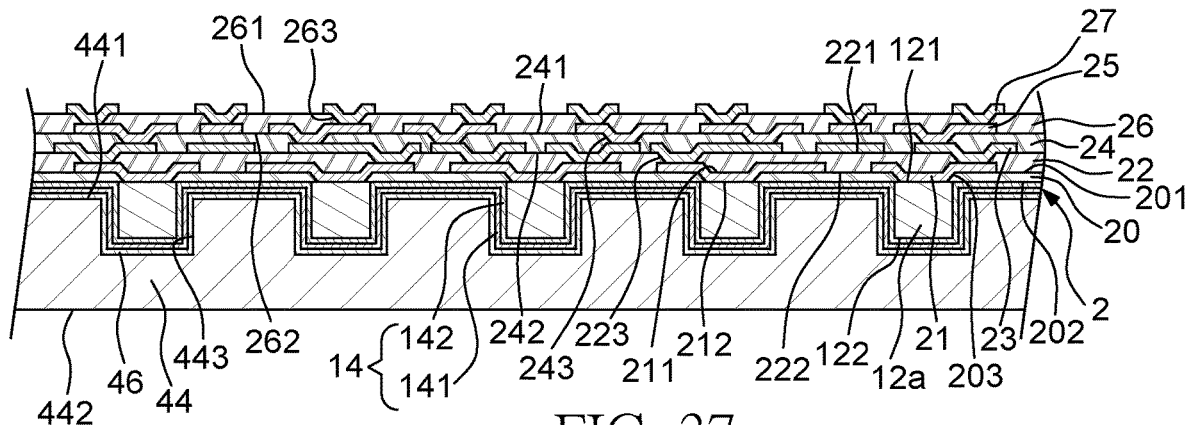
FIG. 37 illustrates one or more stages of an example of a method for manufacturing an electronic device according to some embodiments of the present disclosure.

Referring to FIG. 37, a second insulating layer 22, a second metal layer 23, a third insulating layer 24, a third metal layer 25, a fourth insulating layer 26, at least one under bump metallization (UBM) 27 are formed on the first insulating layer 20 and the first metal layer 21 subsequently, so as to form the wiring structure 2. In some embodiments, if the carrier 44, the release layer 46 and the seed layer 14 are removed, the electronic device 1b of FIG. 5 is obtained. It is noted that the conductive material 12a becomes the electrical connecting element 12. In some embodiments, if a barrier layer 16 (FIG. 8) is formed on the conductive material 12a before the formation of the first metal layer 21 (e.g., before the stage of FIG. 36), the electronic device 1c of FIG. 8 is obtained.

Figure 38:
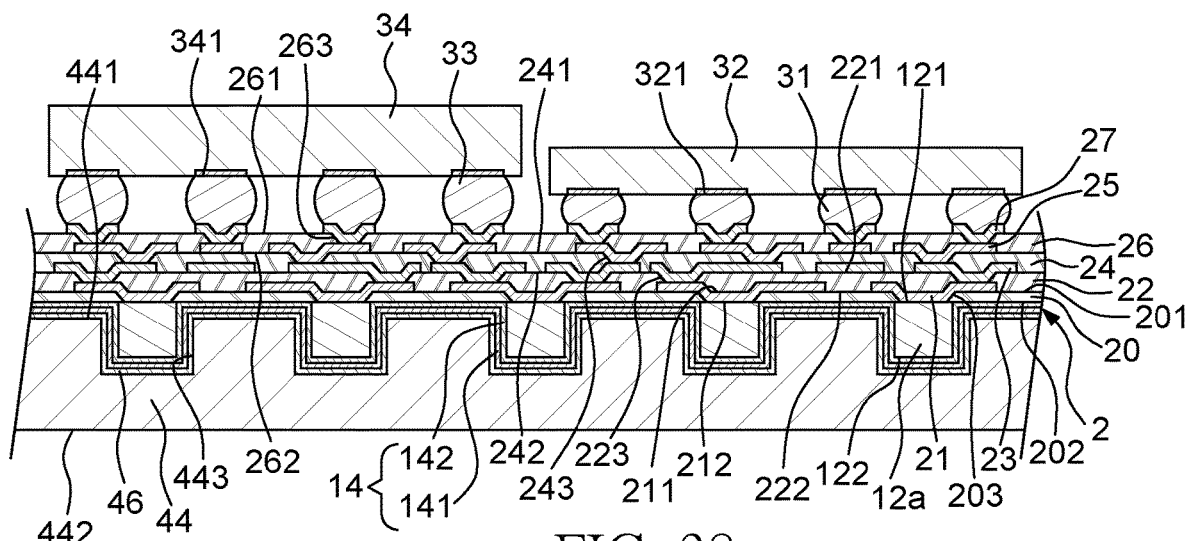
FIG. 38 illustrates one or more stages of an example of a method for manufacturing an electronic device according to some embodiments of the present disclosure.

Referring to FIG. 38, a first semiconductor die 32 and a second semiconductor die 34 are electrically connected to the wiring structure 2. The first semiconductor die 32 is electrically connected to the third metal layer 25 of the wiring structure 2 through the first interconnecting element 31 and the UBM 27 by clip chip bonding. The second semiconductor die 34 is electrically connected to the third metal layer 25 of the wiring structure 2 through the second interconnecting element 33 and the UBM 27 by clip chip bonding.

Figure 39:
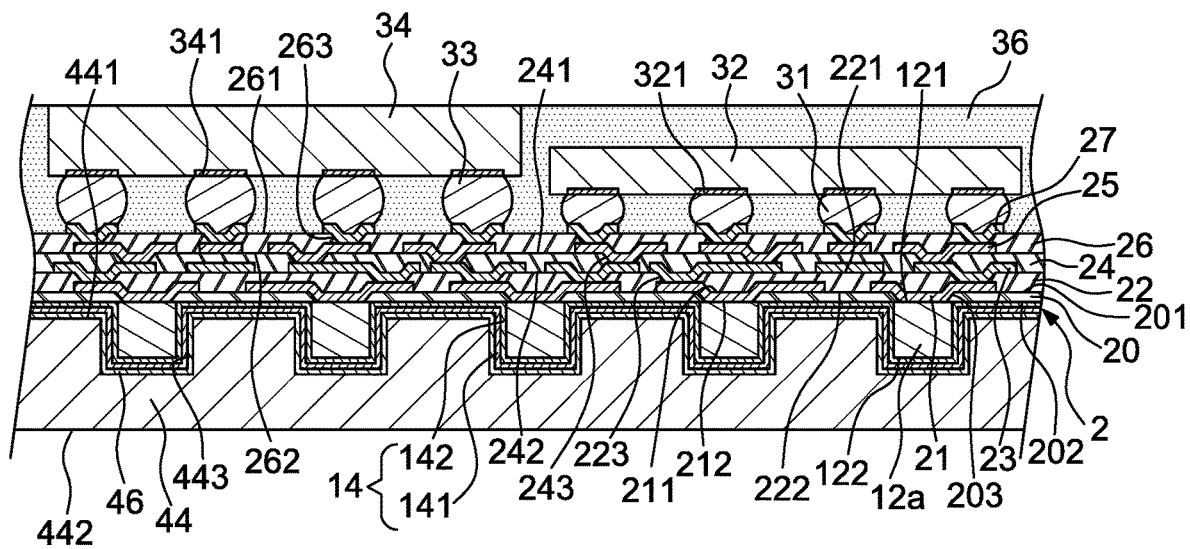
FIG. 39 illustrates one or more stages of an example of a method for manufacturing an electronic device according to some embodiments of the present disclosure.

Referring to FIG. 39, an encapsulant 36 is formed or disposed on the fourth insulating layer 26 of the wiring structure 2 to encapsulate and cover the first semiconductor die 32, the first interconnecting element 31, the second semiconductor die 34, the second interconnecting element 33 and the UBM 27.

Figure 40:
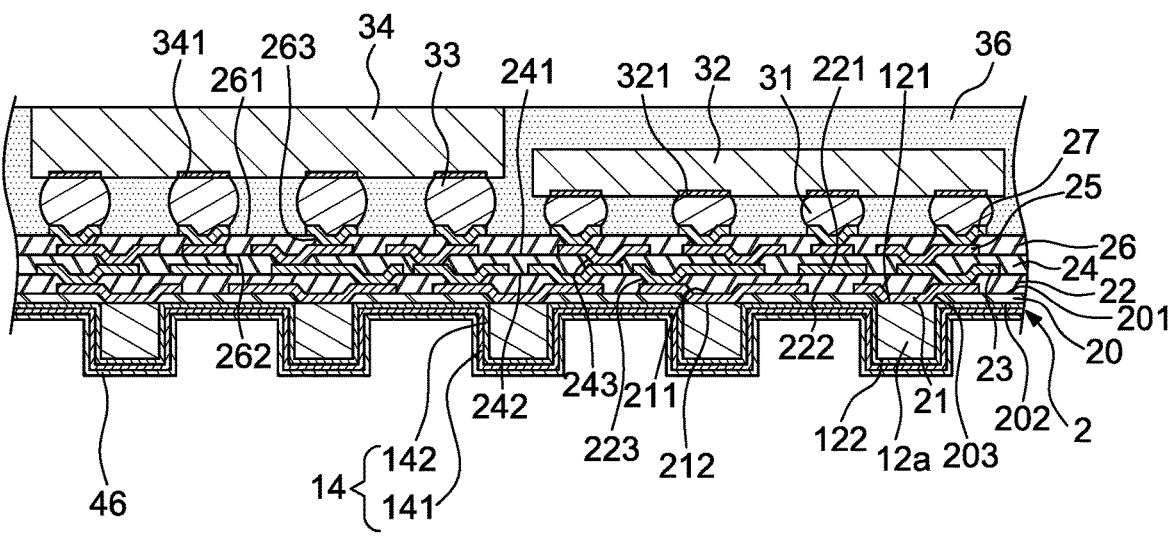
FIG. 40 illustrates one or more stages of an example of a method for manufacturing an electronic device according to some embodiments of the present disclosure.

Referring to FIG. 40, the carrier 44 is removed. Meanwhile, even a warpage occurs to the wiring structure 2 and the encapsulant 36, the conductive material 12a may shift or move together with the exposed portion (e.g., bonding pad) of the bottom surface 212 of the first metal layer 21. Thus, the yield rate of the bonding between the conductive material 12a and the wiring structure 2 is improved.

Figure 41:
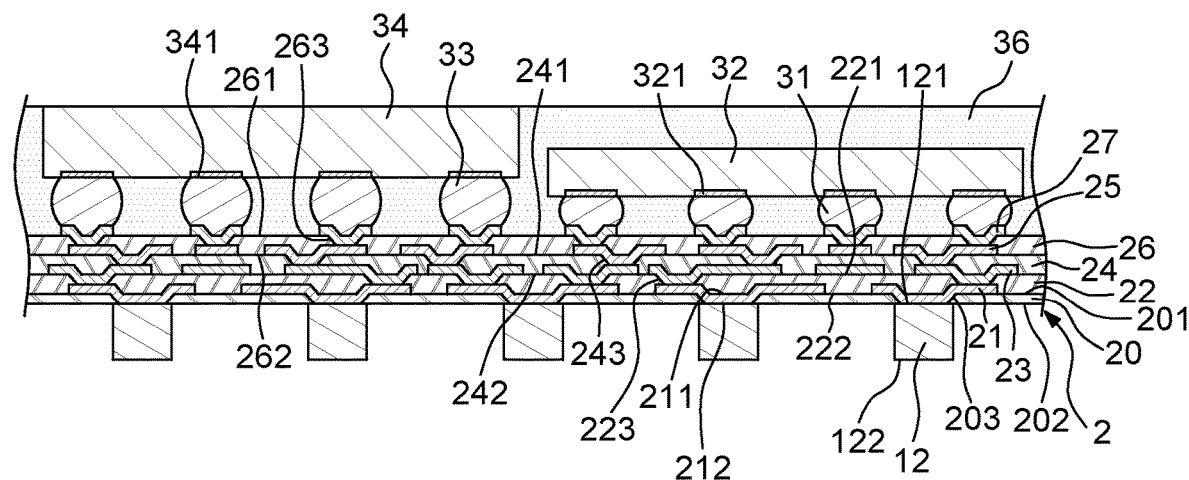
FIG. 41 illustrates one or more stages of an example of a method for manufacturing an electronic device according to some embodiments of the present disclosure.

Referring to FIG. 41, the release layer 46 and the seed layer 14 are removed. Meanwhile, the conductive material 12a becomes the electrical connecting element 12. Then, a singulation process is conducted so as to obtain the electronic device 3a (e.g., a semiconductor package structure) as shown in FIG. 7. It is noted that, if a reflow process is conducted to the electronic device 3a of FIG. 7, the electrical connecting element 12 (e.g., the conductive material 12a) is reflowed and melted to become a ball shape due to the cohesion force, so as to obtain the electronic device 3e (e.g., a semiconductor package structure) as shown in FIG. 13.

FIG. 42 through FIG. 54 illustrate a method for manufacturing an electronic device 3b (e.g., a semiconductor package structure) according to some embodiments of the present disclosure. In some embodiments, the method is for manufacturing an electronic device such as the electronic device 3b (e.g., a semiconductor package structure) shown in FIG. 9.

Figure 42:
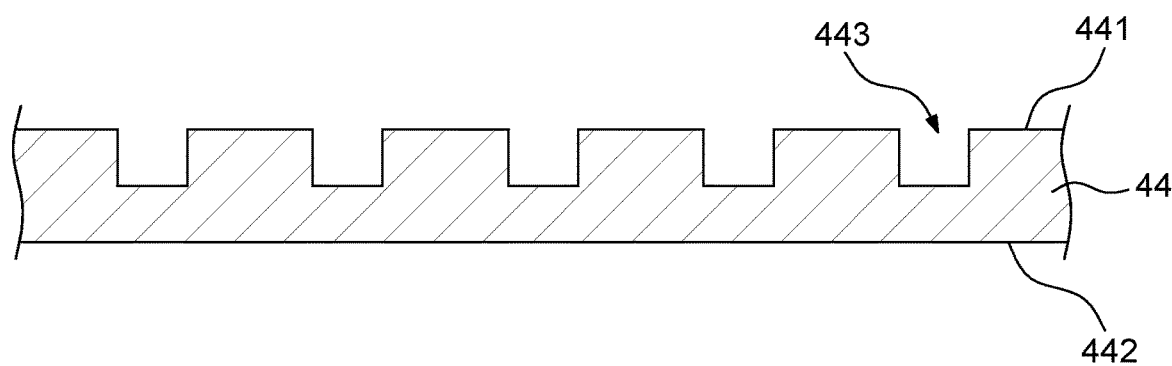
FIG. 42 illustrates one or more stages of an example of a method for manufacturing an electronic device according to some embodiments of the present disclosure.

Referring to FIG. 42, a carrier 44 is provided. The carrier 44 has a first surface 441 and a second surface 442 opposite to the first surface 441, and defines a plurality of openings 443 on the first surface 441. Each of the openings 443 is a blind hole that is recessed from the first surface 441 and does not extend through the carrier 44.

Figure 43:
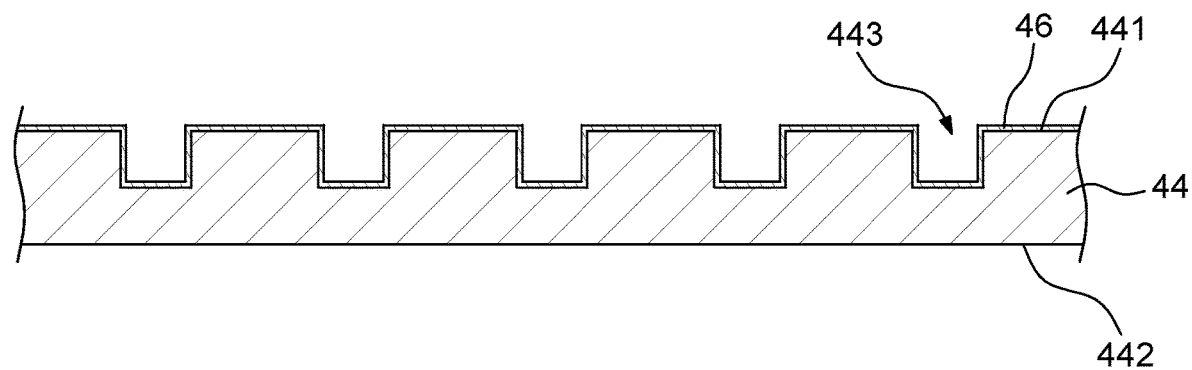
FIG. 43 illustrates one or more stages of an example of a method for manufacturing an electronic device according to some embodiments of the present disclosure.

Referring to FIG. 43, a release layer 46 is formed or disposed on the first surface 441 and in the openings 443 of the carrier 44 by, for example, coating.

Figure 44:
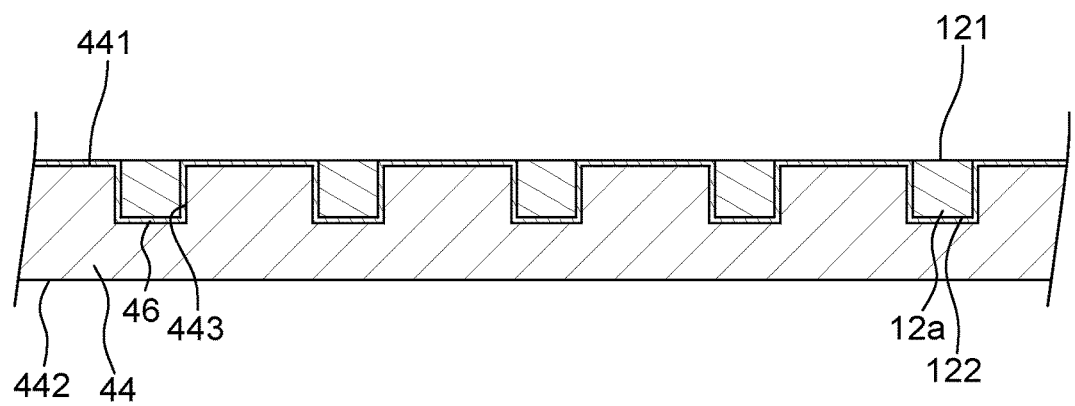
FIG. 44 illustrates one or more stages of an example of a method for manufacturing an electronic device according to some embodiments of the present disclosure.

Referring to FIG. 44, a conductive material 12a is formed or disposed on the release layer 46 in the openings 443 of the carrier 44 by, for example, printing. In some embodiments, a top surface 121 of the conductive material 12a may be substantially coplanar with a top surface of the release layer 46 on the first surface 441 of the carrier 44.

Figure 45:
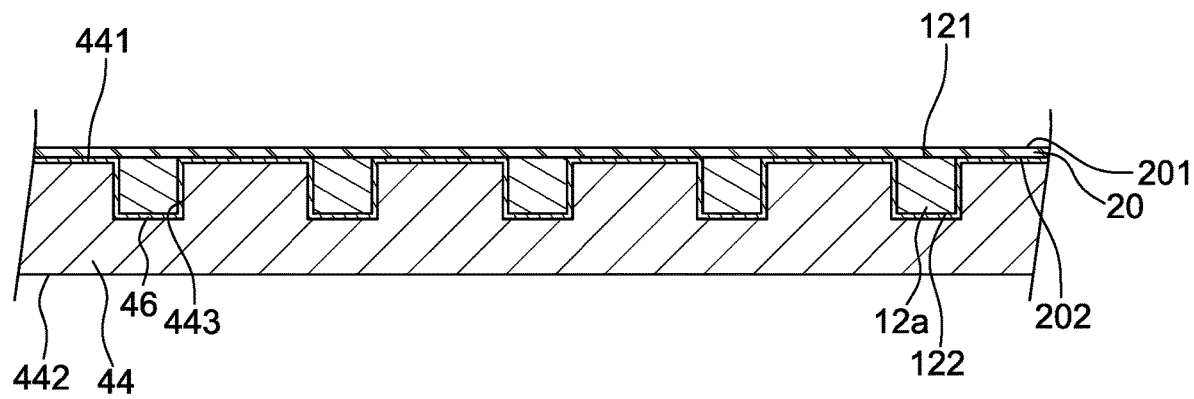
FIG. 45 illustrates one or more stages of an example of a method for manufacturing an electronic device according to some embodiments of the present disclosure.

Referring to FIG. 45 to FIG. 50, a wiring structure 2 is formed or disposed on the conductive material 12a and on the release layer 46 that is on the first surface 441 of the carrier 44. Referring to FIG. 45, a first insulating layer 20 is formed or disposed on the conductive material 12a and on the release layer 46 by, for example, coating. The first insulating layer 20 has a top surface 201 and a bottom surface 202 opposite to the top surface 201. The top surface 121 of the conductive material 12a may be substantially coplanar with the bottom surface 202 of the first insulating layer 20.

Figure 46:
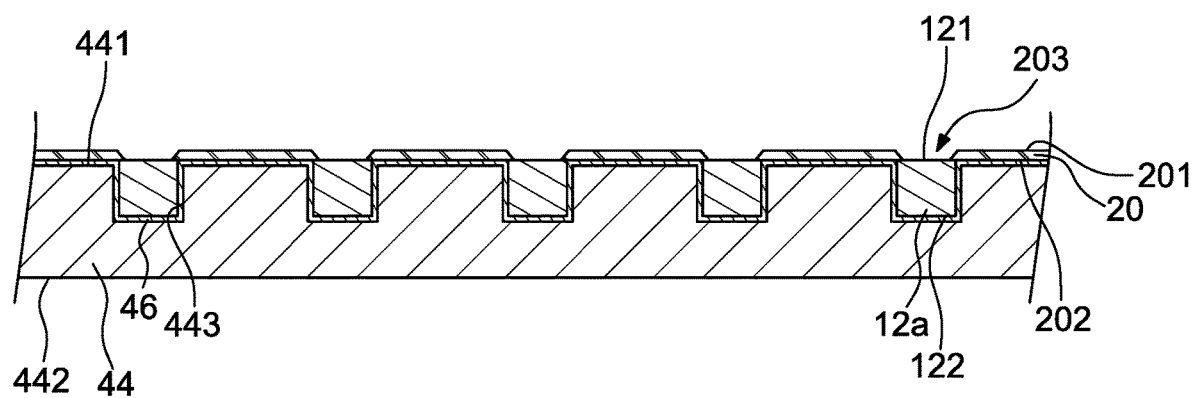
FIG. 46 illustrates one or more stages of an example of a method for manufacturing an electronic device according to some embodiments of the present disclosure.

Referring to FIG. 46, portions of the first insulating layer 20 are removed by, for example, photolithography, to form a plurality of openings 203 to expose portions of the conductive material 12a. The opening 203 extends through the first insulating layer 20, that is, the opening 203 extends between the top surface 201 and the bottom surface 202. The position of the opening 203 may correspond to the position of the conductive material 12a. As shown in FIG. 46, the opening 203 is disposed right above the conductive material 12a.

Figure 47:
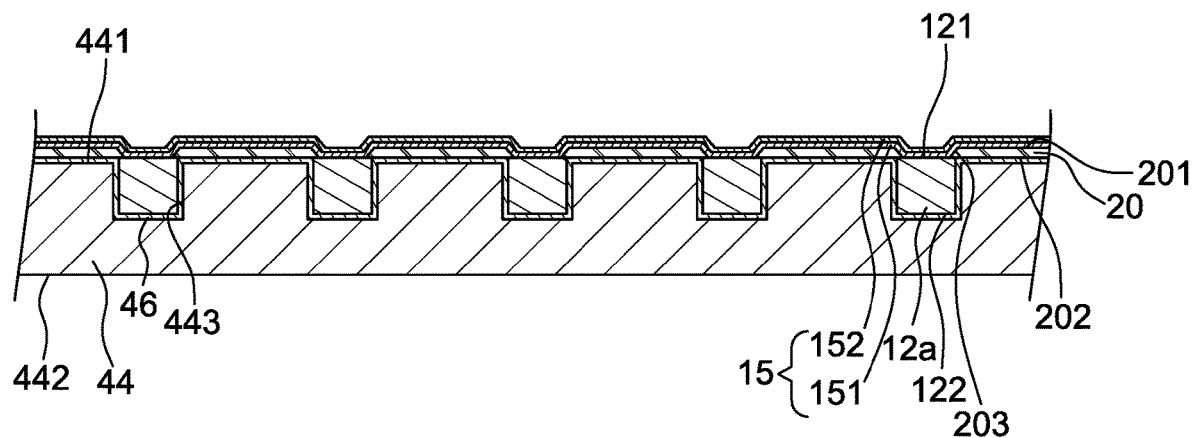
FIG. 47 illustrates one or more stages of an example of a method for manufacturing an electronic device according to some embodiments of the present disclosure.

Referring to FIG. 47, a seed layer 15 is formed or disposed on the conductive material 12a and on the top surface 201 of the first insulating layer 20 by, for example, sputtering. In some embodiments, the seed layer 15 may include a first conductive layer 151 and a second conductive layer 152. A material of the first conductive layer 151 of the seed layer 15 includes titanium-tungsten (TiW) alloy that may be formed by physical vapor deposition (PVD). A material of the second conductive layer 152 of the seed layer 15 includes copper that may be formed on the first conductive layer 151 by physical vapor deposition (PVD). As shown in FIG. 47, the first conductive layer 151 of the seed layer 15 contacts and/or is electrically connected to the conductive material 12a.

Figure 48:
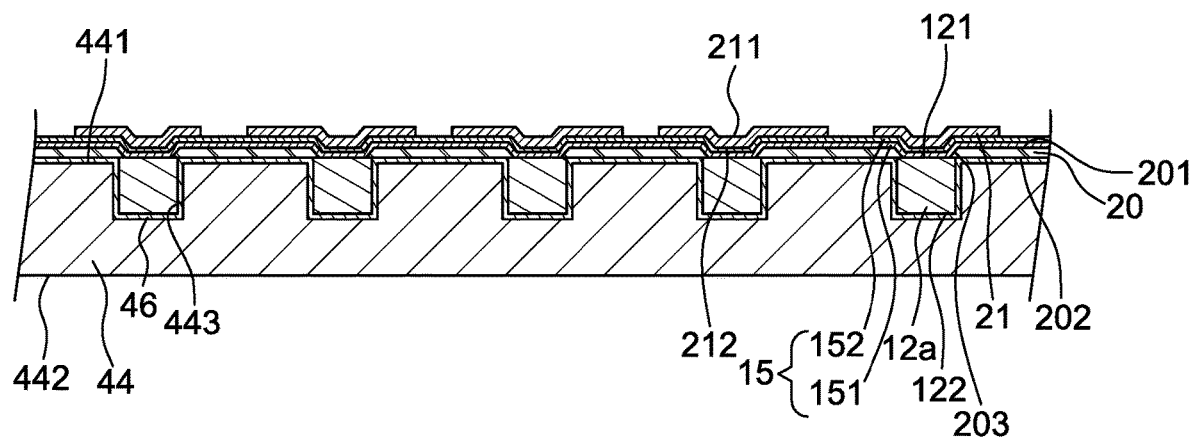
FIG. 48 illustrates one or more stages of an example of a method for manufacturing an electronic device according to some embodiments of the present disclosure.

Referring to FIG. 48, a first metal layer 21 is formed in the openings 203 of the first insulating layer 20 and on the seed layer 15. The first metal layer 21 may be a patterned circuit structure (e.g., a redistribution layer (RDL)), and is disposed on the top surface of the seed layer 15 and in the opening 203 of the first insulating layer 20. The first metal layer 21 has a top surface 211 and a bottom surface 212 opposite to the top surface 211. Meanwhile, the conductive material 12a is attached to and electrically connected to the bottom surface 212 of the first metal layer 21 through the seed layer 15.

Figure 49:
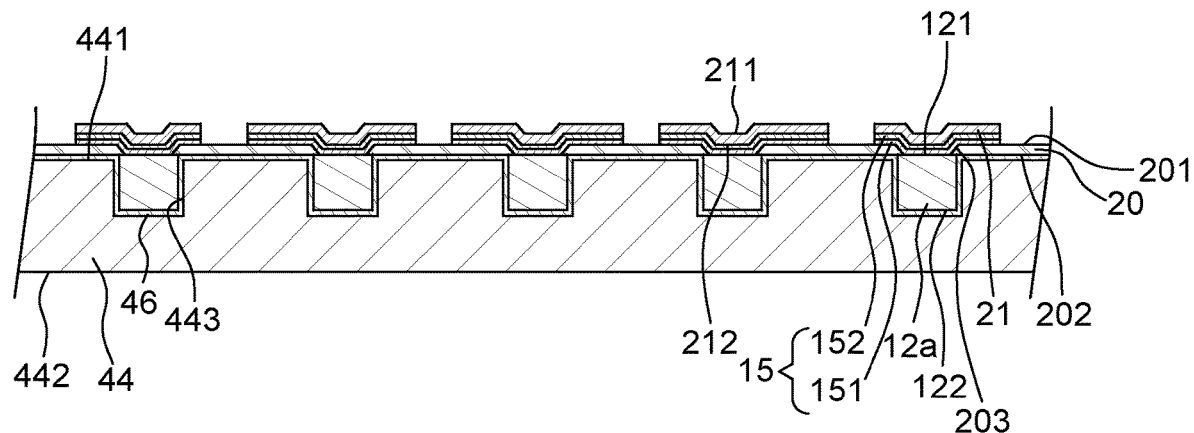
FIG. 49 illustrates one or more stages of an example of a method for manufacturing an electronic device according to some embodiments of the present disclosure.

Referring to FIG. 49, portions of the seed layer 15 that are not covered by the first metal layer 21 are removed by, for example, etching.

Figure 50:
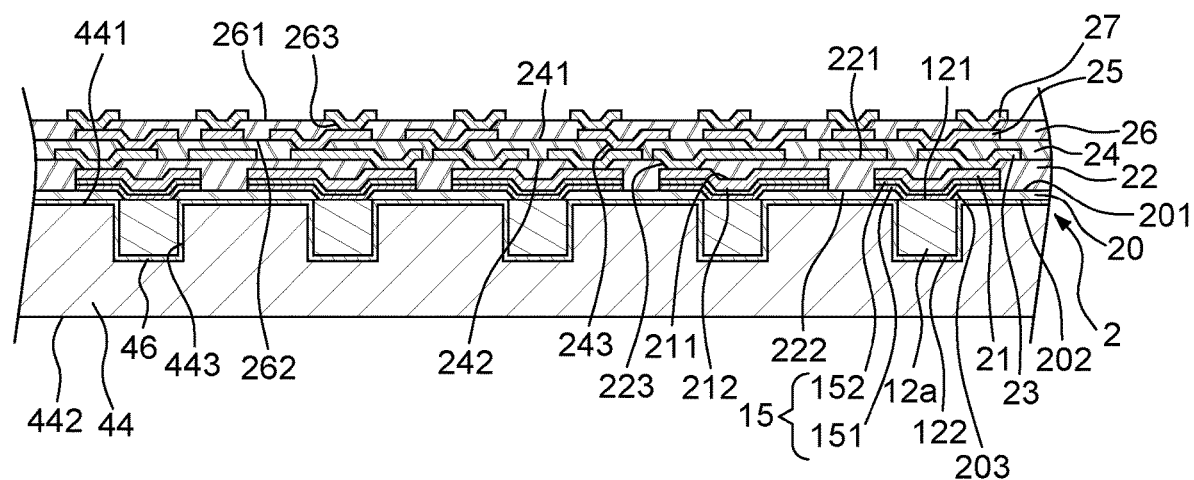
FIG. 50 illustrates one or more stages of an example of a method for manufacturing an electronic device according to some embodiments of the present disclosure.

Referring to FIG. 50, a second insulating layer 22, a second metal layer 23, a third insulating layer 24, a third metal layer 25, a fourth insulating layer 26, at least one under bump metallization (UBM) 27 are formed on the first insulating layer 20 and the first metal layer 21 subsequently, so as to form the wiring structure 2. In some embodiments, if the carrier 44 and the release layer 46 are removed, the electronic device 1d of FIG. 9 is obtained. It is noted that the conductive material 12a becomes the electrical connecting element 12.

Figure 51:
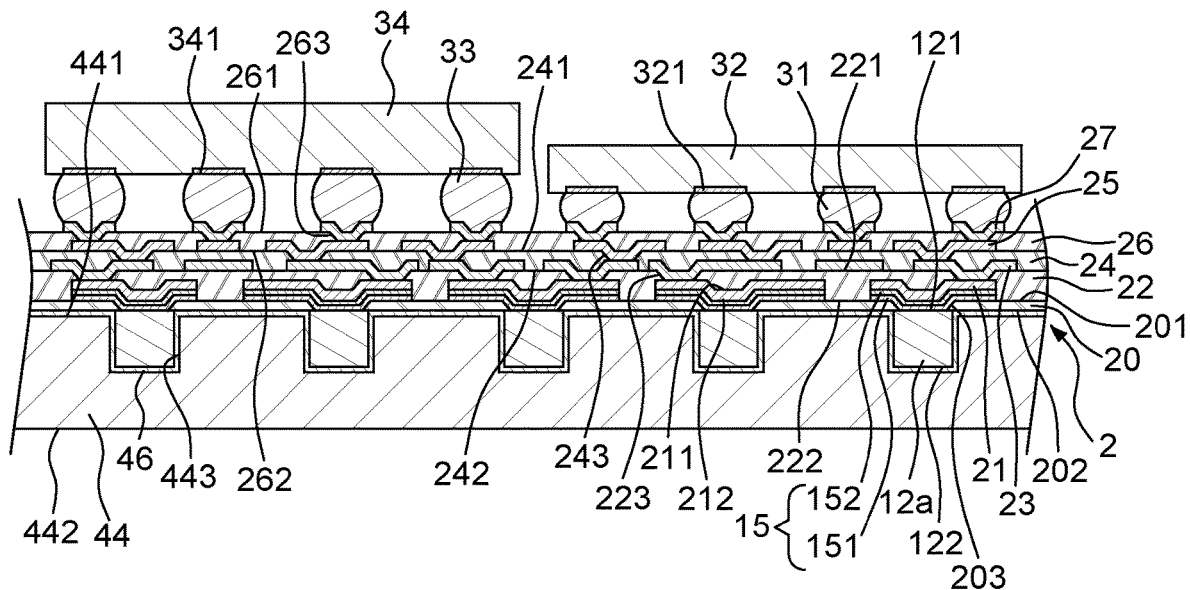
FIG. 51 illustrates one or more stages of an example of a method for manufacturing an electronic device according to some embodiments of the present disclosure.

Referring to FIG. 51, a first semiconductor die 32 and a second semiconductor die 34 are electrically connected to the wiring structure 2. The first semiconductor die 32 is electrically connected to the third metal layer 25 of the wiring structure 2 through the first interconnecting element 31 and the UBM 27 by clip chip bonding. The second semiconductor die 34 is electrically connected to the third metal layer 25 of the wiring structure 2 through the second interconnecting element 33 and the UBM 27 by clip chip bonding.

Figure 52:
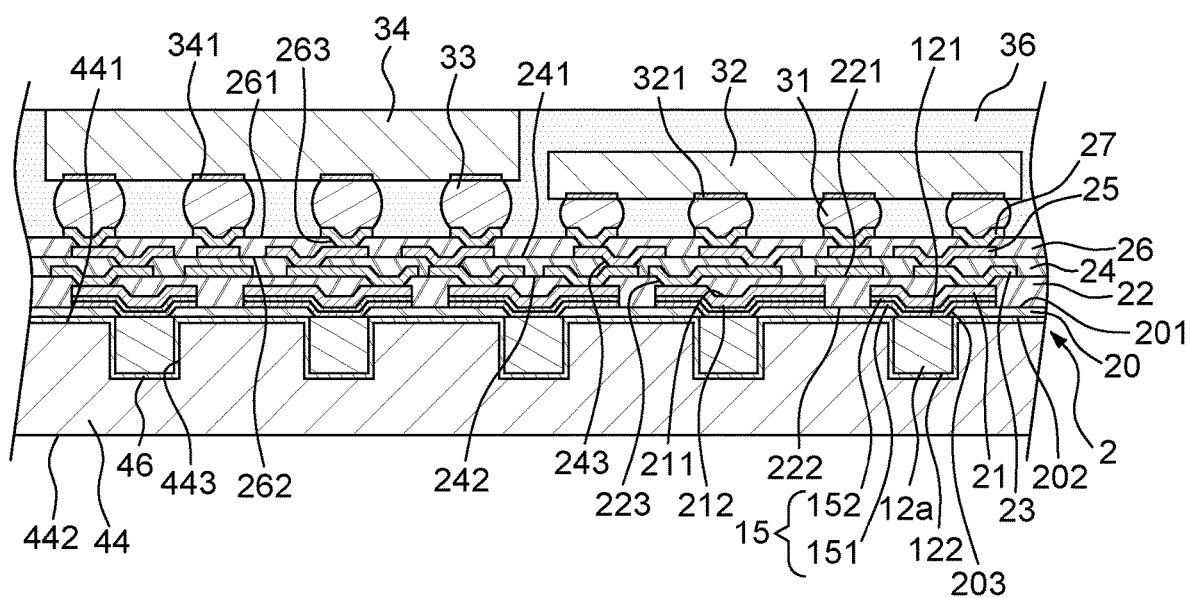
FIG. 52 illustrates one or more stages of an example of a method for manufacturing an electronic device according to some embodiments of the present disclosure.

Referring to FIG. 52, an encapsulant 36 is formed or disposed on the fourth insulating layer 26 of the wiring structure 2 to encapsulate and cover the first semiconductor die 32, the first interconnecting element 31, the second semiconductor die 34, the second interconnecting element 33 and the UBM 27.

Figure 53:
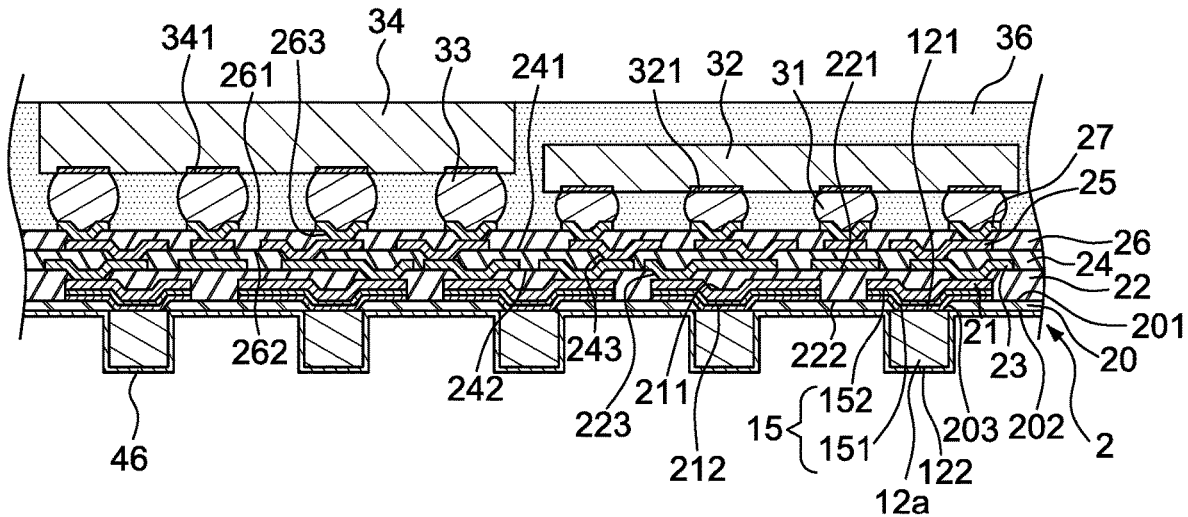
FIG. 53 illustrates one or more stages of an example of a method for manufacturing an electronic device according to some embodiments of the present disclosure.

Referring to FIG. 53, the carrier 44 is removed.

Figure 54:
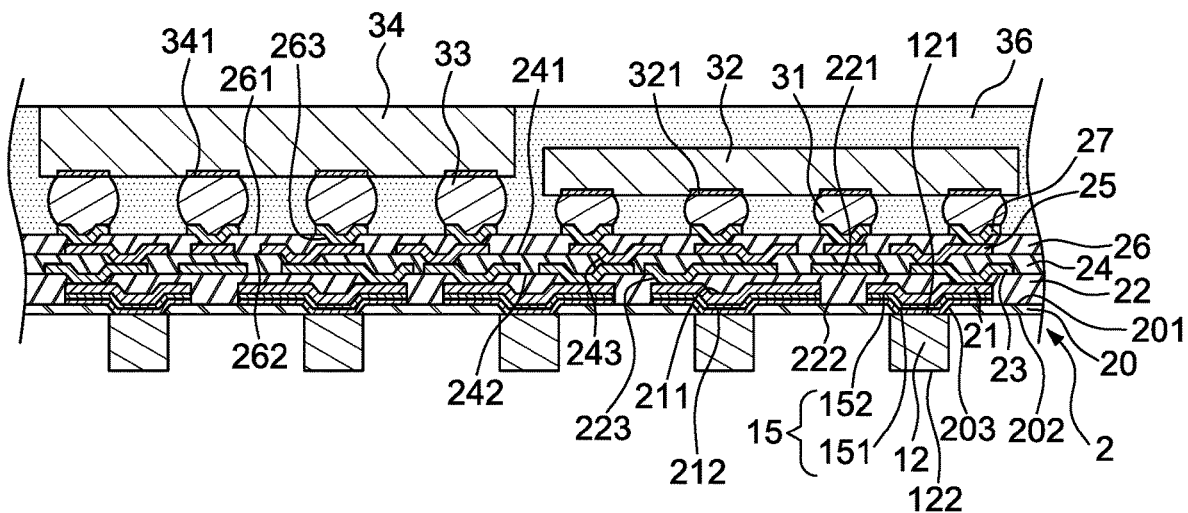
FIG. 54 illustrates one or more stages of an example of a method for manufacturing an electronic device according to some embodiments of the present disclosure.

Referring to FIG. 54, the release layer 46 is removed. Meanwhile, the conductive material 12a becomes the electrical connecting element 12. Then, a singulation process is conducted so as to obtain the electronic device 3b (e.g., a semiconductor package structure) as shown in FIG. 9. It is noted that, if a reflow process is conducted to the electronic device 3b of FIG. 9, the electrical connecting element 12 (e.g., the conductive material 12a) is reflowed and melted to become a ball shape due to the cohesion force, so as to obtain the electronic device 3f (e.g., a semiconductor package structure) as shown in FIG. 14.

FIG. 55 through FIG. 59 illustrate a method for manufacturing an electronic device 3c (e.g., a semiconductor package structure) according to some embodiments of the present disclosure. In some embodiments, the method is for manufacturing an electronic device such as the electronic device 3c (e.g., a semiconductor package structure) shown in FIG. 11.

Figure 55:
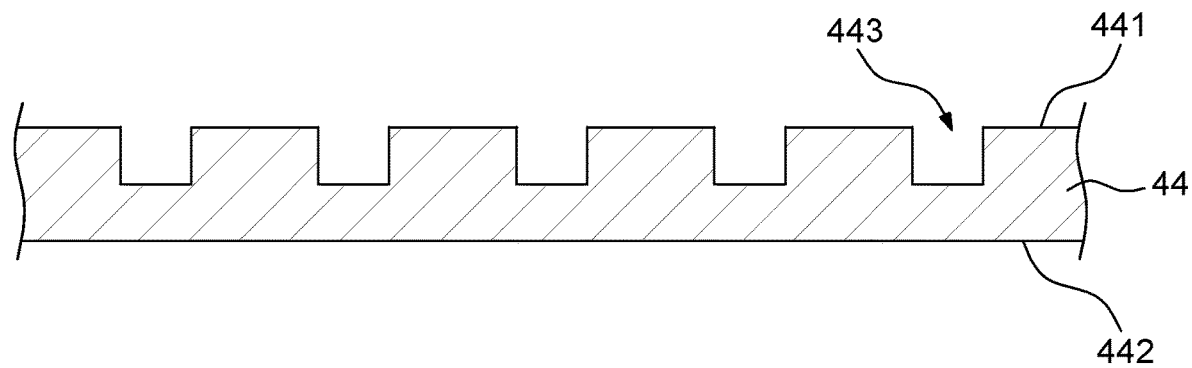
FIG. 55 illustrates one or more stages of an example of a method for manufacturing an electronic device according to some embodiments of the present disclosure.

Referring to FIG. 55, a carrier 44 is provided. The carrier 44 has a first surface 441 and a second surface 442 opposite to the first surface 441, and defines a plurality of openings 443 on the first surface 441. Each of the openings 443 is a blind hole that is recessed from the first surface 441 and does not extend through the carrier 44.

Figure 56:
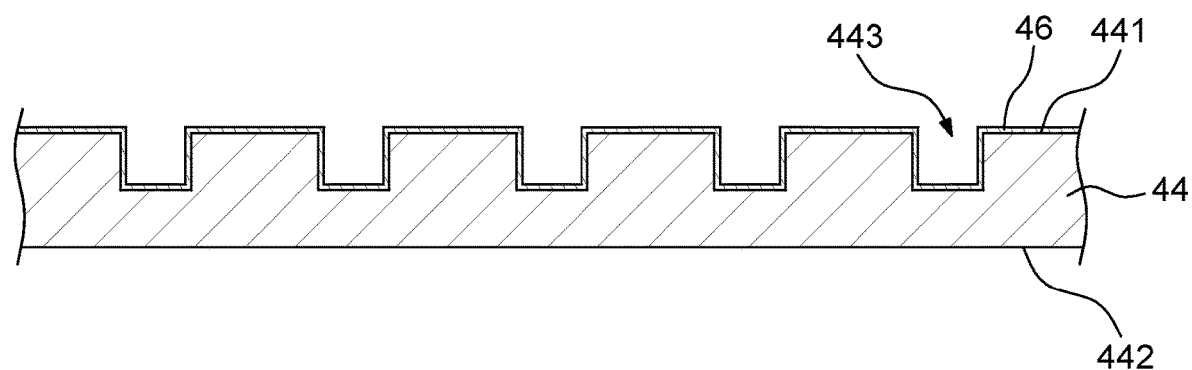
FIG. 56 illustrates one or more stages of an example of a method for manufacturing an electronic device according to some embodiments of the present disclosure.

Referring to FIG. 56, a release layer 46 is formed or disposed on the first surface 441 and in the openings 443 of the carrier 44 by, for example, coating.

Figure 57:
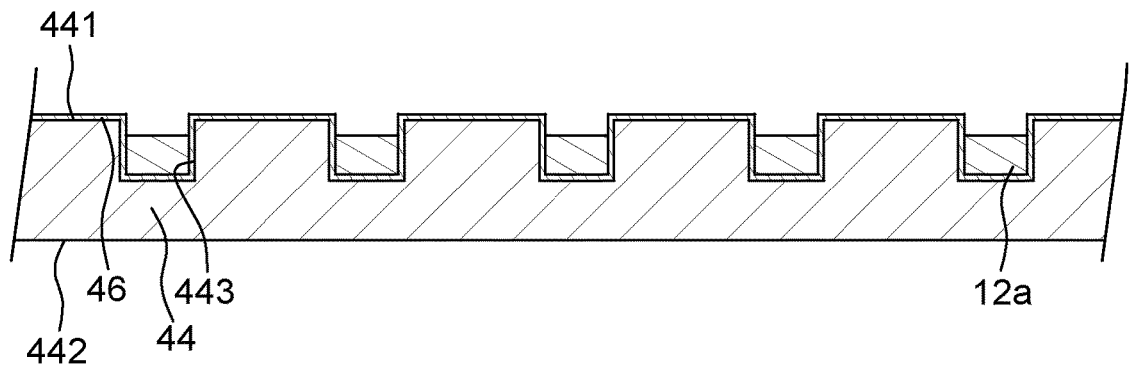
FIG. 57 illustrates one or more stages of an example of a method for manufacturing an electronic device according to some embodiments of the present disclosure.

Referring to FIG. 57, a conductive material 12a is formed or disposed on the release layer 46 in the openings 443 of the carrier 44 by, for example, printing. A material of the conductive material 12a includes a solder material such as silver-tin (AgSn) alloy. In some embodiments, a top surface of the conductive material 12a may be lower than a top surface of the release layer 46 on the first surface 441 of the carrier 44.

Figure 58:
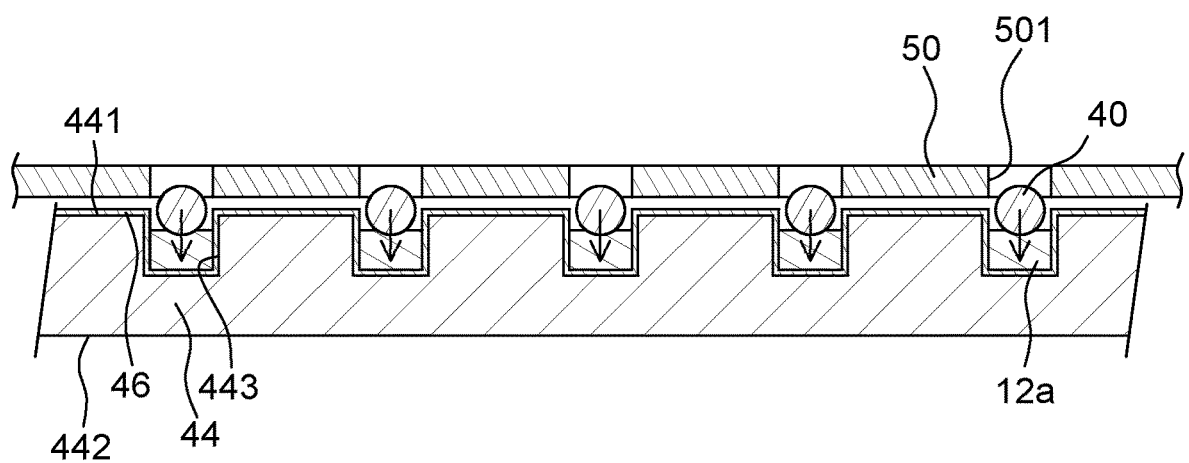
FIG. 58 illustrates one or more stages of an example of a method for manufacturing an electronic device according to some embodiments of the present disclosure.

Referring to FIG. 58, a stencil 50 is provided. The stencil 50 defines a plurality of through holes 501. The position of each of the through holes 501 corresponds to the position of each of the openings 443 of the carrier 44. In some embodiments, each of the through holes 501 of the stencil 50 is disposed right above each of the openings 443 of the carrier 44. Then, a plurality of solid core balls 40 (such as copper core balls) are provided. A solid core ball 40 is disposed on the conductive material 12a in an openings 443 of the carrier 44 through the through hole 501 of the stencil 50.

Figure 59:
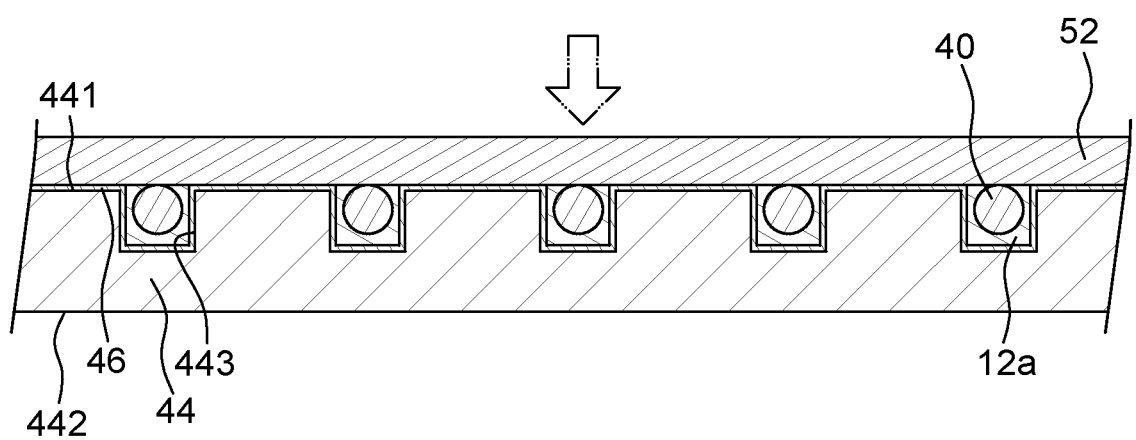
FIG. 59 illustrates one or more stages of an example of a method for manufacturing an electronic device according to some embodiments of the present disclosure.

Referring to FIG. 59, the stencil 50 is removed. Then, a press plate is provided to press the solid core balls 40 downwardly so that the solid core ball 40 is embedded in the conductive material 12a. Then, the stages subsequent to that shown in FIG. 59 of the illustrated process are similar to the stages illustrated in FIG. 20 through FIG. 29, thus forming the electronic device 3c shown in FIG. 11. It is noted that, if a reflow process is conducted to the electronic device 3c of FIG. 11, the electrical connecting element 12 (e.g., the conductive material 12a) is reflowed and melted to become a ball shape due to the cohesion force, so as to obtain the electronic device 3g (e.g., a semiconductor package structure) as shown in FIG. 15.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
    (a) providing a carrier, wherein the carrier has a first surface and defines a plurality of openings on the first surface;
    (a1) forming a release layer in the openings and on the first surface of the carrier;
    (b) forming a conductive material in the openings of the carrier;
    (c) forming a wiring structure on the carrier and the conductive material;
    (d) electrically connecting at least one semiconductor die to the wiring structure;
    (e) forming an encapsulant to cover the at least one semiconductor die;
    (f) removing the carrier; and
    (g) reflowing the conductive material.

2. The method of claim 1, wherein after (f), the method further comprises:
    (f1) removing the release layer.

3. The method of claim 1, wherein in (b), the conductive material is formed by printing or electroplating.

4. The method of claim 3, wherein after (a1), the method further comprises:
    (a2) forming a seed layer on the release layer.

5. The method of claim 4, wherein after (f), the method further comprises:
    (f1) removing the seed layer.

6. The method of claim 3, wherein in (b), the conductive material is formed by printing; and after (b), the method further comprises:
    (b1) forming a seed layer on the conductive material and on the release layer that is disposed on the first surface of the carrier.

7. The method of claim 6, wherein (c) includes:
    (c1) forming an insulating layer on the seed layer;
    (c2) removing portions of the insulating layer to form a plurality of openings to expose portions of the seed layer; and
    (c3) forming a metal layer in the openings of the insulating layer and on the exposed portions of the seed layer.

8. The method of claim 6, wherein after (f), the method further comprises:
    (f1) removing portions of the seed layer that are not covered by the conductive material.

9. The method of claim 1, wherein in (a), a gap between the openings of the carrier is less than 50 µm, and an aspect ratio of the opening is greater than or equal to 1.

10. The method of claim 1, wherein after (b), the method further comprises:
    (b1) disposing a solid core ball in the conductive material in the opening of the carrier.

11. The method of claim 7, wherein in (c1), the seed layer comprises a first conductive layer and a second conductive layer, and the insulating layer is formed on the second conductive layer of the seed layer.

12. The method of claim 11, wherein a material of the first conductive layer of the seed layer comprises titanium-tungsten (TiW) alloy.

13. The method of claim 11, wherein a thickness of the first conductive layer is less than 1 µm.

14. The method of claim 11, wherein a material of the second conductive layer of the seed layer comprises copper.

15. The method of claim 11, wherein a thickness of the second conductive layer is less than 1 µm.

16. The method of claim 7, wherein in (c2), the openings extend through the insulating layer.

17. The method of claim 7, wherein in (c2), a position of the openings corresponds to a position of the conductive material.

18. The method of claim 7, wherein in (c3), a thickness of the metal layer is greater than or equal to a thickness of the insulating layer.

* * * * *